United States Patent
Tanabe

(10) Patent No.: US 10,854,609 B2
(45) Date of Patent: Dec. 1, 2020

(54) SEMICONDUCTOR DEVICE

(71) Applicant: Renesas Electronics Corporation, Tokyo (JP)

(72) Inventor: Akira Tanabe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 91 days.

(21) Appl. No.: 16/005,825

(22) Filed: Jun. 12, 2018

(65) Prior Publication Data

US 2018/0374852 A1 Dec. 27, 2018

(30) Foreign Application Priority Data

Jun. 27, 2017 (JP) ................. 2017-125210

(51) Int. Cl.
*H01L 27/092* (2006.01)
*H01L 21/8234* (2006.01)
*H03K 17/06* (2006.01)
*H01L 21/8238* (2006.01)

(52) U.S. Cl.
CPC .. *H01L 27/0928* (2013.01); *H01L 21/823493* (2013.01); *H03K 17/063* (2013.01); *H01L 21/823892* (2013.01); *H03K 2017/066* (2013.01); *H03K 2217/0018* (2013.01); *H03K 2217/0036* (2013.01)

(58) Field of Classification Search
CPC ......... H01L 27/0928; H01L 21/823493; H01L 21/823892; H03K 17/063; H03K 2017/066; H03K 2217/0018; H03K 2217/0036
See application file for complete search history.

(56) References Cited

U.S. PATENT DOCUMENTS

| 6,340,825 | B1 | 1/2002 | Shibata et al. |
| 7,596,013 | B2 * | 9/2009 | Yamaoka ............... G11C 11/417 365/154 |
| 7,791,403 | B2 * | 9/2010 | Cho ................... H03K 19/0016 326/33 |

(Continued)

FOREIGN PATENT DOCUMENTS

| JP | 09-036246 A | 2/1997 |
| JP | 2004-031411 A | 1/2004 |
| JP | 2005-175505 A | 6/2005 |

OTHER PUBLICATIONS

Japanese Notice of Reasons for Refusal issued in corresponding Japanese Patent Application No. 2017-125210, dated Sep. 15, 2020, with English translation.

*Primary Examiner* — Fernando L Toledo
*Assistant Examiner* — Neil R Prasad
(74) *Attorney, Agent, or Firm* — McDermott Will & Emery LLP

(57) ABSTRACT

Wells formed in a semiconductor device can be discharged faster in a transition from a stand-by state to an active state. The semiconductor device includes an n-type well applied, in an active state, with a power supply voltage and, in a stand-by state, with a voltage higher than the power supply voltage, a p-type well applied, in the active state, with a ground voltage and, in the stand-by state, with a voltage lower than the ground voltage, and a path which, in a transition from the stand-by state to the active state, electrically couples the n-type well and the p-type well.

7 Claims, 21 Drawing Sheets

(56) References Cited

U.S. PATENT DOCUMENTS

| | | | |
|---|---|---|---|
| 7,859,062 B1* | 12/2010 | Koniaris | H03K 19/0027 |
| | | | 257/371 |
| 2002/0030533 A1* | 3/2002 | De | H01L 27/0928 |
| | | | 327/534 |
| 2003/0234427 A1 | 12/2003 | Kono | |
| 2018/0005685 A1* | 1/2018 | Hasegawa | G05F 3/205 |

* cited by examiner

SEMICONDUCTOR DEVICE

CROSS-REFERENCE TO RELATED APPLICATIONS

The disclosure of Japanese Patent Application No. 2017-125210 filed on Jun. 27, 2017 including the specification, drawings and abstract is incorporated herein by reference in its entirety.

BACKGROUND

This disclosure relates to a semiconductor device and is applicable, for example, to a semiconductor device which dynamically changes a back bias.

There has been a technique which makes it possible to speed up operation of a semiconductor device when the semiconductor device is active (operating) and reduce power consumption when the semiconductor device is not active (standing-by) (see, for example, Japanese Unexamined Patent Application Publication No. Hei 9 (1997)-36246). In the technique, when a semiconductor device is active, high speed operation is enabled by lowering the threshold voltages of MOSFETs (Metal Oxide Semiconductor Field Effect Transistors) through well potential control and, when the semiconductor device is in a stand-by state, power consumption is reduced by raising the threshold voltages and thereby reducing the current flow in a sub-threshold region.

SUMMARY

According to the technique disclosed in Japanese Unexamined Patent Application Publication No. Hei 9 (1997)-36246), when a semiconductor device shifts from a stand-by state to an active state, the wells formed in p-channel MOSFETs are discharged only through a power supply and the wells formed in n-channel MOSFETs are discharged only through ground. Particularly, it is difficult to make discharging through a power supply faster due to limitation by the output impedance of the power supply circuit.

Other objects and novel features of the present invention will become apparent from the following specification and accompanying drawings.

A representative semiconductor device disclosed in this disclosure is briefly described as follows.

A semiconductor device includes an n-type well applied, in an active state, with a power supply voltage and, in a stand-by state, with a voltage higher than the power supply voltage, a p-type well applied, in the active state, with a ground voltage and, in the stand-by state, with a voltage lower than the ground voltage, and a path which, in a transition from the stand-by state to the active state, electrically couples the n-type well with the p-type well.

According to the above semiconductor device, when a transition is made from a stand-by state to an active state, the n-type well can be discharged faster.

DETAILED DESCRIPTION

Figure 1:
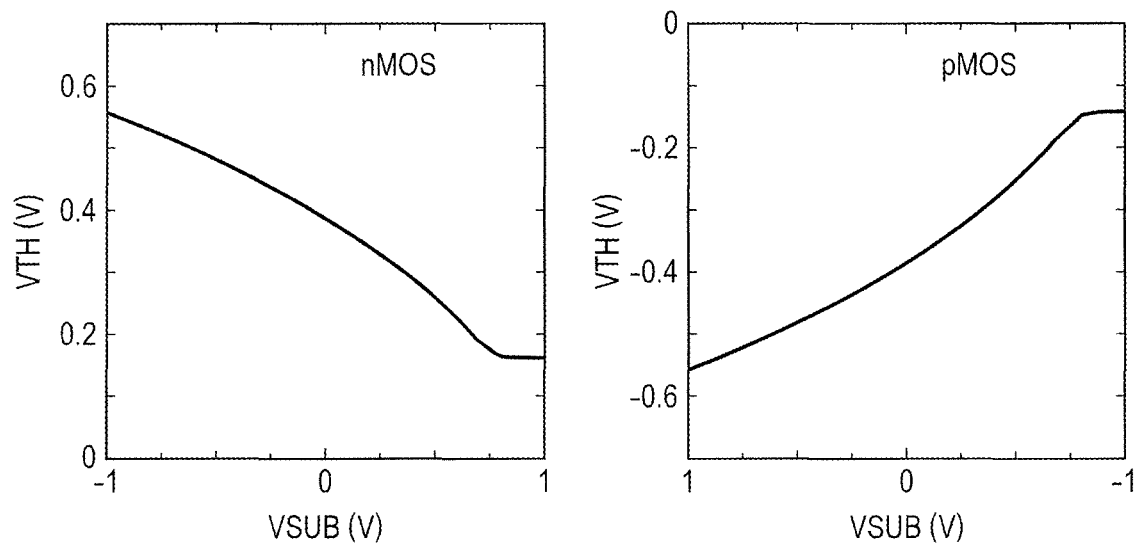
FIG. 1 illustrates relationships between threshold voltages of MOSFETs and back biases.

First, with reference to FIG. 1, the relationships between the threshold voltages and back biases of MOSFETs will be described. FIG. 1 illustrates the relationships between back bias voltages (VSUB) and threshold voltages (VTH) of MOSFETs. In FIG. 1, the graph on the left represents the relationship in the case of an n-channel MOSFET and the graph on the right represents the relationship in the case of a p-channel MOSFET.

The threshold voltage (VTH) of a MOSFET can be varied by varying the back bias voltage (VSUB) applied to a substrate terminal. As shown in FIG. 1, in the case of an n-channel MOSFET (hereinafter referred to as an "nMOS"), making the back bias negative increases the absolute value of the threshold voltage. Conversely, in the case of a p-channel MOSFET (hereinafter referred to as a "pMOS"), making the back bias positive increases the absolute value of the threshold voltage.

Figure 2:
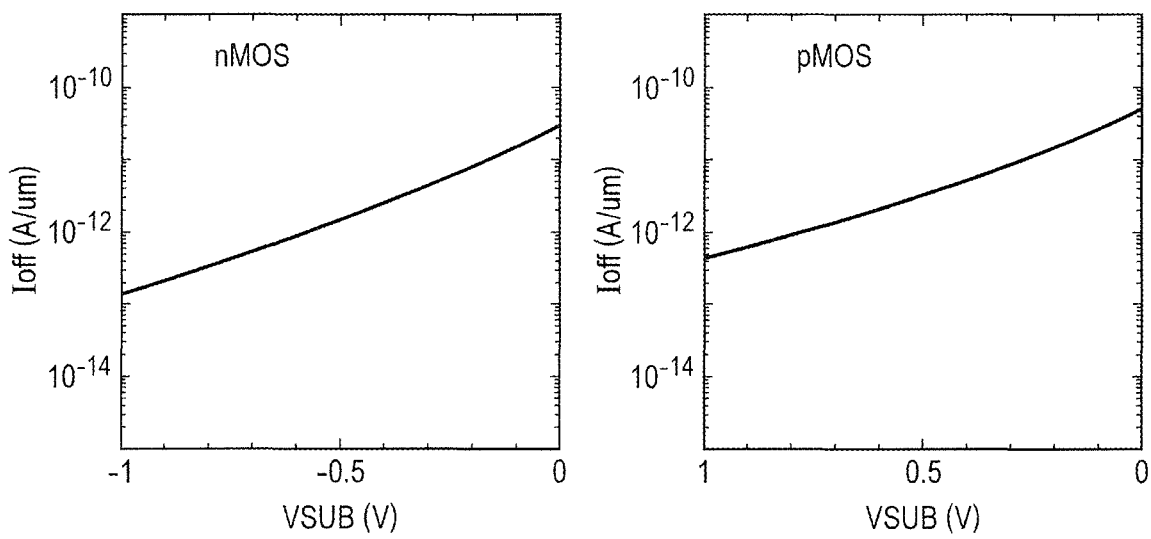
FIG. 2 illustrates relationships between leak currents of MOSFETs and back biases.

Next, with reference to FIG. 2, the relationships between leakage currents and back biases of MOSFETs will be described. FIG. 2 illustrates example relationships between back bias voltages (VSUB) and leakage currents (Ioff) of MOSFETs in an off state. In FIG. 2, the graph on the left represents the relationship in the case of an nMOS and the graph on the right represents the relationship in the case of a pMOS.

For MOSFETs, a dominant factor in leakage current is a sub-threshold leakage current. In the case of an nMOS, the leakage current can be reduced by making the back bias negative and, in the case of a pMOS, the leakage current can be reduced by making the back bias positive. The leakage current exponentially varies reacting to back bias changes. Therefore, the leakage current variation is large when the back bias is in the vicinity of 0 V and, as the back bias is increased, the leakage current variation reduces.

Figure 3:
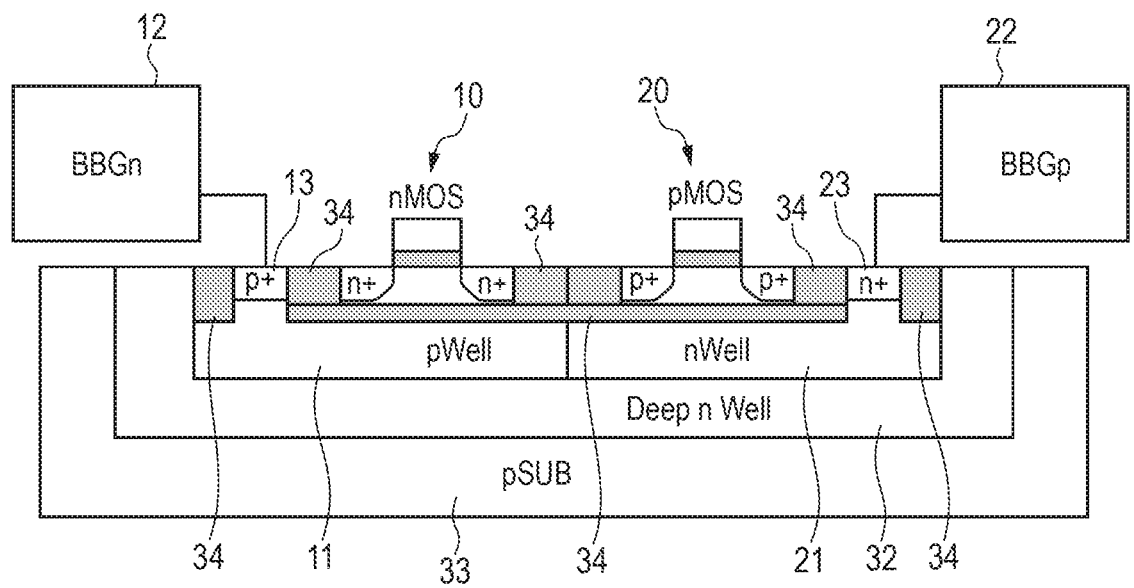
FIG. 3 is a diagram for describing back bias control.

Next, with reference to FIG. 3, back bias control for a silicon-on-insulator (SOI) type MOSFETs (SOI-MOSFETs) will be described. FIG. 3 shows, as an example of arrangement for back bias control for SOI-MOSFETs, a sectional structure of a substrate and areas where a back bias is applied.

An nMOS 10 and a pMOS 20 are formed in a p-type well (pWell) 11 and an n-type well (nWell) 21, respectively, and a dedicated back bias generator (BBGn) 12 and a dedicated back bias generator (BBGp) 22 are coupled to the p-type well 11 and the n-type well 21 via n-type high-concentration impurity (n+) regions 13 and 23, respectively. In this arrangement, the back biases applied to the nMOS 10 and the pMOS 20 are varied simultaneously. When the circuit is operating (in an active state), the back biases are set to cause the thresholds to be low so as to allow high-speed switching to realize high-speed circuit operation. When the circuit is inactive (in a stand-by state), the back biases are set to cause the thresholds to be high so as to reduce the leakage currents and power consumption. By dynamically controlling the back biases as stated above, high-speed operation and low power consumption can both be achieved. The p-type well 11 and the n-type well 21 are formed in a deep n-type well (Deep n Well) 32. The deep n-type well 32 is formed in a p-type substrate (pSUB) 33. The nMOS 10 and the pMOS 20, the nMOS 10 and the p-type well 11, and the pMOS 20 and the n-type well 21 are respectively isolated from each other by a silicon oxide film 34.

Figure 4:
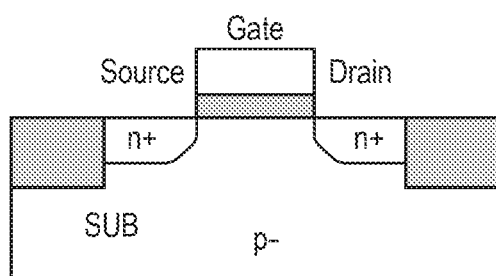
FIG. 4 is a diagram for describing aback bias of an SOI-MOSFET.

Next, with reference to FIGS. 4 and 5, a bulk MOSFET and an SOI-MOSFET will be described. FIG. 4 is a sectional view of a bulk MOSFET and FIG. 5 is a sectional view of an SOI-MOSFET.

As shown in FIG. 4, in the case of a bulk MOSFET, the substrate (SUB) and the source and drain terminals of the MOSFET are coupled via p-n junctions. Therefore, the voltage that can be set as a back bias is limited to be within a range where no p-n junction forward current flows (substrate potential (back bias))<source/drain potential).

Figure 5:
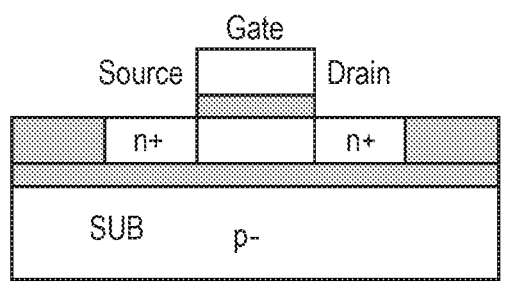
FIG. 5 is a diagram for describing a back bias applied to an SOI-MOSFET.

In the case of an SOI-MOSFET, a silicon oxide film layer is formed for insulation between the substrate (SUB) and the source and drain terminals as shown in FIG. 5. Therefore, the above limitation as to the range of back bias voltage does not apply and a wide range of back bias voltage can be set (the substrate potential (back bias) and the source and drain potentials are mutually independent.) In the case of an SOI-MOSFET, therefore, the threshold value can be varied more widely than in the case of a bulk MOS FET by varying the back bias. Thus, the characteristics of an SOI-MOSFET can be widely varied by back bias control and this allows an SOI-MOSFET, compared with a bulk MOSFET, to operate at high speed with low power consumption.

Figure 6:
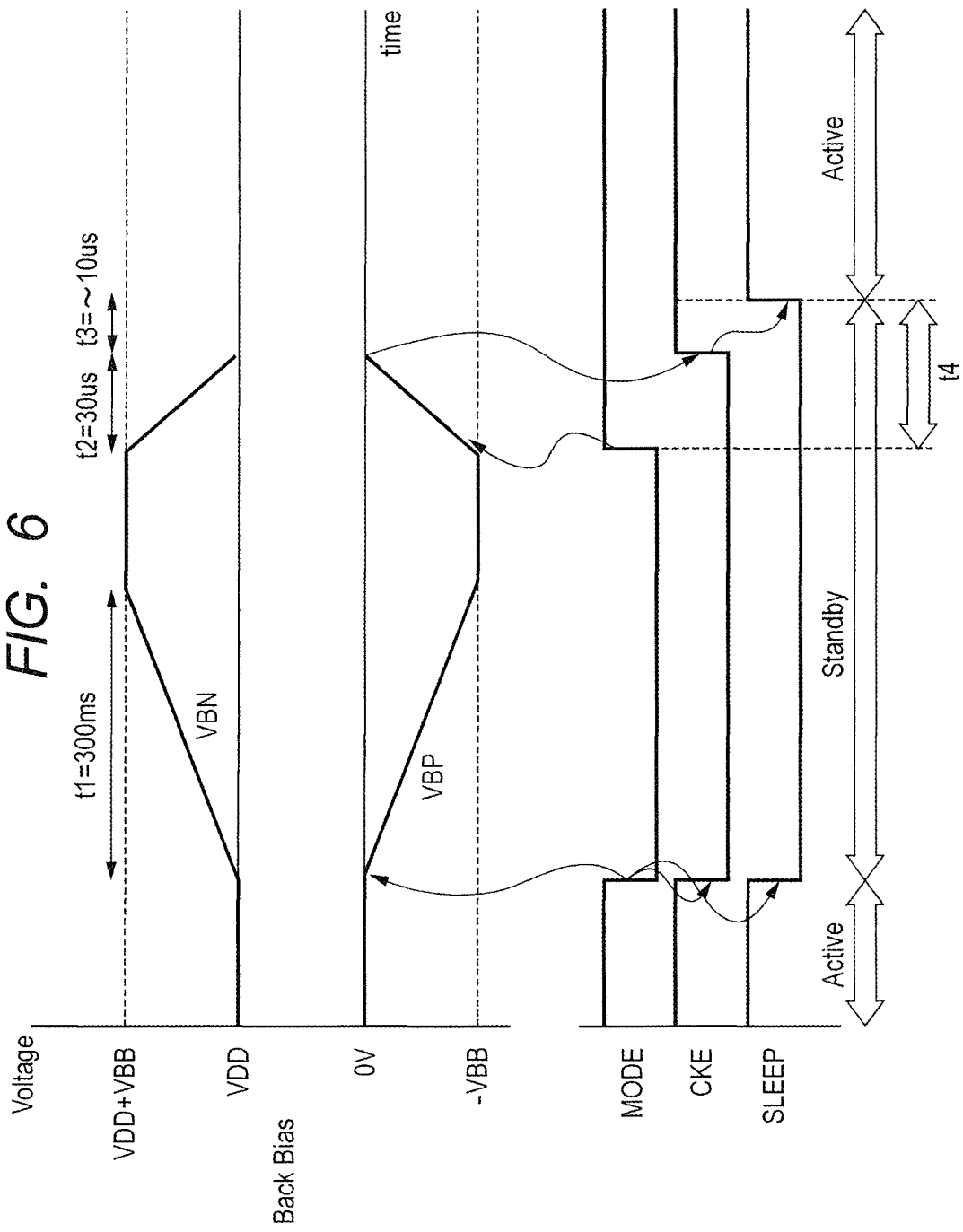
FIG. 6 is a diagram for describing back bias control.

Next, with reference to FIG. 6, back bias control in an active state and in a stand-by state of a circuit including MOSFETs will be described. FIG. 6 is a timing chart representing back bias control in an active state and in a stand-by state of a circuit including MOSFETs. In the timing chart, the vertical axis represents voltage and the horizontal axis represents time.

The supply voltage of the circuit is denoted as "VDD". When the circuit is in an active state, keeping the back bias (VBP) for an nMOS 10 at 0 V and the back bias (VBN) for a pMOS 20 at VDD decreases the absolute values of the thresholds causing the on currents to increase and this enables the circuit to operate at high speed. Next, when the circuit is in a stand-by state, keeping the back bias (VBP) for the nMOS 10 at −VBB and the back bias (VBN) for the pMOS 20 at VDD+VBB increases the absolute values of the thresholds causing the leakage currents to decrease and, as a result, the current consumption in the stand-by state can be decreased. However, for practical back bias control, it is necessary to vary the back biases at high speed and, thereby, speed up transitions both to a stand-by state and to an active state. Circuit-wise, a MOSFET substrate, whether bulk or SOI, can be regarded as a capacitor, so that, to shorten the time taken for transitions between an active state and a stand-by state, it is necessary to make charging and discharging of the substrate at high speed.

When a low power-consumption instruction of the CPU is executed and a mode control signal (MODE) goes low, a clock start/stop signal (CKE) goes low. As a result, the clock stops and a CPU start/stop signal (SLEEP) goes low causing the CPU to stop and the circuit to enter a stand-by state (Standby). Also, when the mode control signal goes low, a charge pump circuit of each back bias generator operates and generates a stand-by state back bias. For example, the transition time (t1) from an operating (active) state back bias to a stand-by state back bias is 300 ms.

When the mode control signal goes high, for example, in response to an interrupt signal received from outside, the charge pump circuit of each back bias generator stops, the active-state back bias voltages (VDD and 0 V) are applied and the wells are discharged. For example, the transition time (t2) taken for a transition from the stand-by state back bias voltage to the active state back bias voltage is 30 μs. The clock activation time (t3) is 10 μs. The time (t4) taken for a return from the stand-by state plus an interrupt latency time is t4=t2+t3=40 μs.

Particularly, in the case of a return from a stand-by state, return operation is performed based on a mode control signal (MODE) generated by an interrupt signal received from outside as shown in FIG. 6 and, after completion of the return, interrupt processing is performed. Namely, a delay of the return operation results in a delay of the interrupt processing. It is, therefore, necessary to finish the return operation in a period of time short enough not to affect the interrupt processing. Generally, interrupt processing by a microcontroller is, in fast cases, finished in several microseconds, so that the return operation is required to be finished in a comparable period of time.

Figure 7:
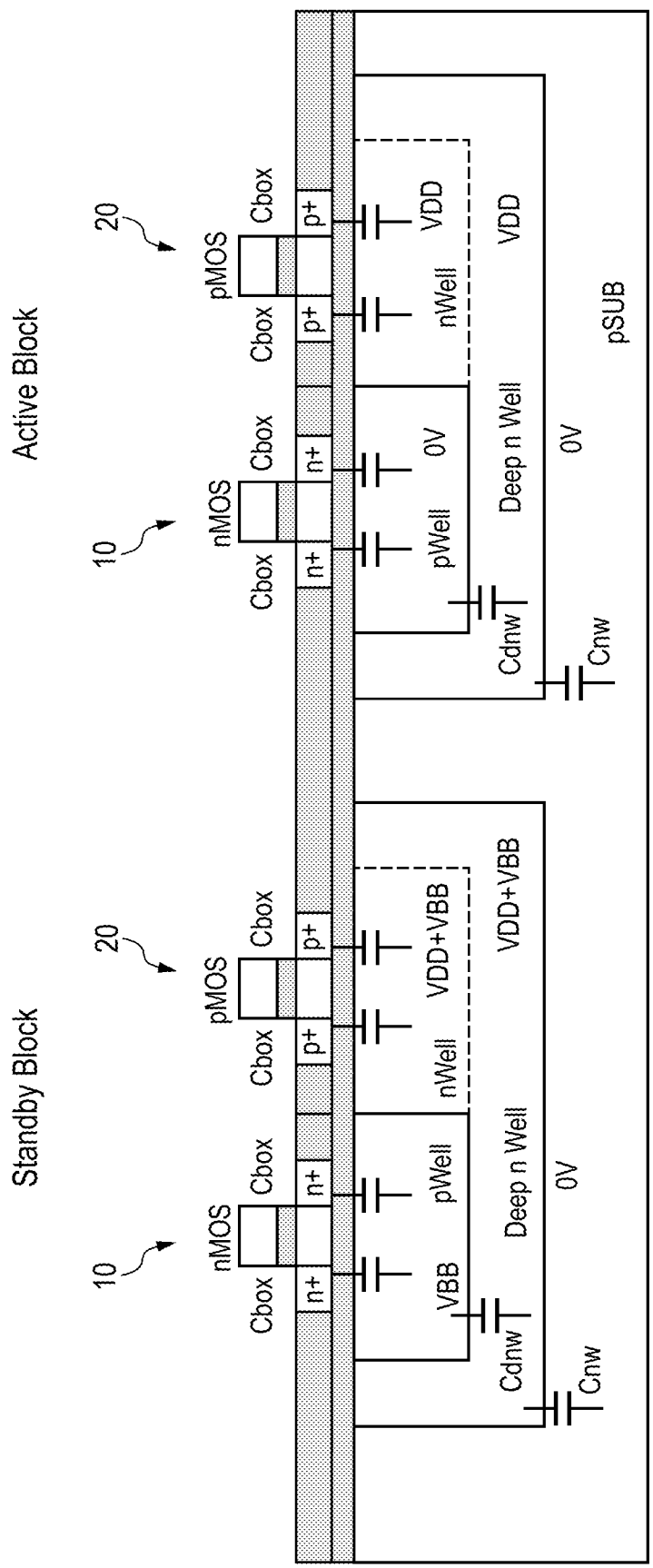
FIG. 7 is a diagram for describing deep n-type wells.

Next, with reference to FIG. 7, deep n-type wells will be described. FIG. 7 is a sectional view of a substrate structure with regions where the back bias voltage is varied and other regions where the back bias voltage is not varied formed over a same semiconductor chip. Though the structure shown in FIG. 7 is of an SOI substrate, a bulk substrate also has a similar structure.

Regions where the back bias voltage is varied and other regions where the back bias voltage is not varied are desirably formed indifferent circuit blocks. When the regions where the back bias voltage is varied and the regions where the back bias voltage is not varied, that is, the blocks in a stand-by state (Standby Block) and the blocks in an active state (Active Block) are both present, disposing them in respectively different deep n-type wells (Deep n Wells) makes it possible to apply different back biases to different blocks each formed of a deep n-type well. Namely, for a chip having a function to vary the back bias voltage on a block-by-block basis, it is imperative to dispose each block to be applied with a back bias in a deep n-type well. Note that deep n-type wells are used in cases where the supporting substrate is of a p-type (pSUB).

When wells are structured as described above, various inter-well capacitances are present as shown in FIG. 7. Main inter-well capacitances are capacitances (Cnw) between n-type wells and the supporting substrate, capacitances (Cdnw) between n-type wells and p-type wells, and capacitances (Cbox) between n-type wells and a diffusion layer or between p wells and a diffusion layer. Since, deep n-type wells (Deep n Wells) and n-type wells are conductively continuous, the capacitances between p-type wells and deep n-type wells and the capacitances between p-type wells and n-type wells are collectively denoted as "Cdnw". Regarding these capacitances, the diffusion layer area is generally as small as ⅒ of the well area or less, so that the capacitances (Cbox) with respect to the diffusion layer can be ignored. Hence, as to capacitance, only the Cnw and Cdnw will be described in the following.

Figure 8:
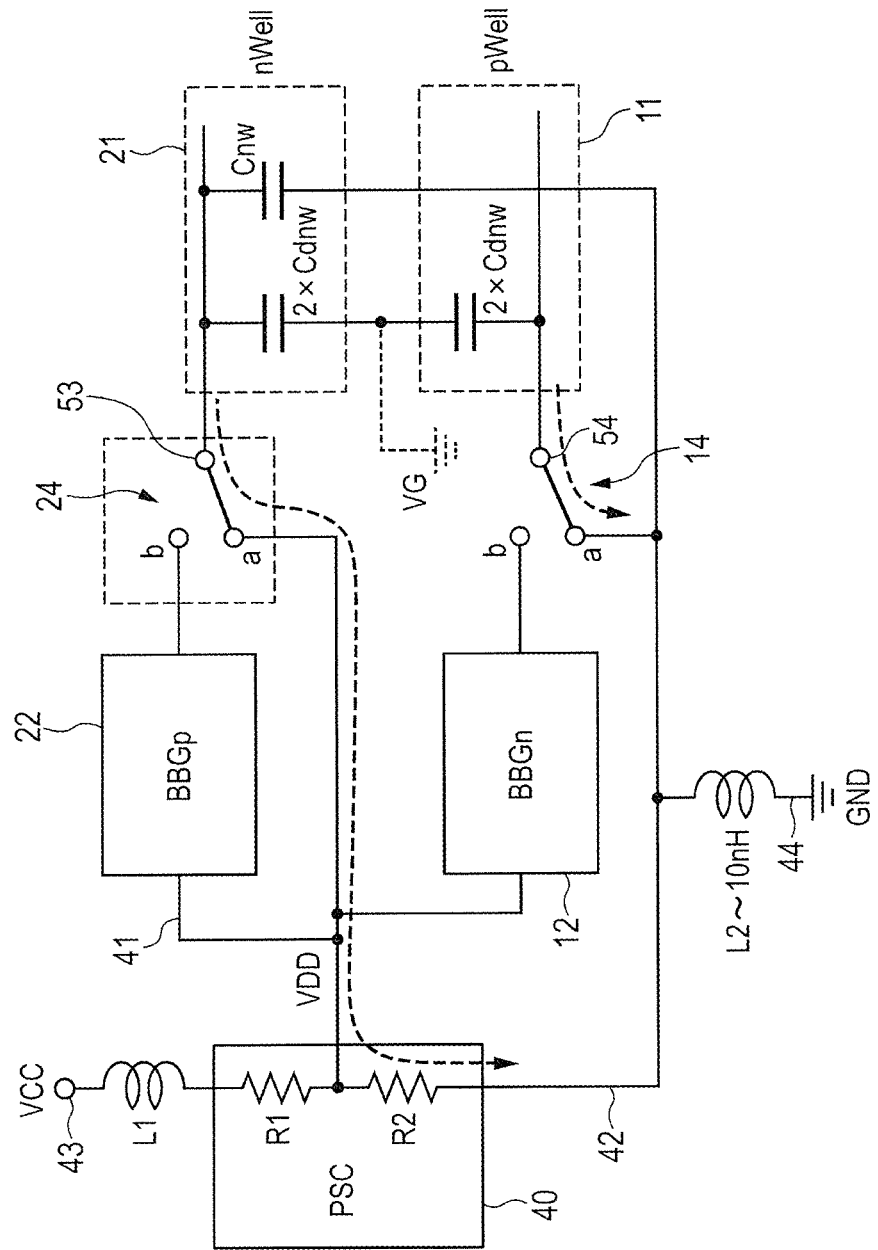
FIG. 8 is a diagram for describing back bias control according to an example for comparison.

Next, with reference to FIG. 8, back bias control (an example for comparison) considered by the present inventors for the structure shown in FIG. 7 will be described. FIG. 8 is a block diagram of a back bias control circuit including a back bias generator according to the example for comparison. In FIG. 8, as for well capacitances, only Cnw and Cdnw are represented. Cdnw represents not a capacitance with respect to ground but a capacitance between an n-type well and a p-type well and, in FIG. 8, serially coupled Cdnw capacitances are denoted as "2×Cdnw". Furthermore, the joint between the two (2×Cdnw) capacitances is a node where voltage does not vary, it is represented as virtual ground (VG).

In the case of an ordinary microcontroller, the voltage (VCC) applied to an external power supply input terminal 43 is about 3.3 to 5 V, whereas the voltage (VDD) for the internal circuit is relatively low ranging from about 1 to 2V. Hence, a power supply circuit 40 for voltage conversion from VCC to VDD is provided.

During the period of an initial active state, the n-type well 21 is equalized with the power supply potential (VDD) and the p-type well 11 is equalized with the ground potential (GND). At this time, switches 14 and 24 making up back bias switching circuits are both positioned on the a side.

For a transition to a stand-by state, the switches 14 and 24 are set to the b side. This couples the n-type well 21 to the BBGp 22 for pMOS to raise the potential of the n-type well 21 to (VDD+VBB) to be higher than the power supply potential (VDD). At the same time, the p-type well 11 is coupled to the back bias generator (BBGn) 12 for nMOS and the potential of the p-type well 11 is lowered to −VBB to be lower than the ground potential (GND).

For a transition from the stand-by state to an active state (for a return), the switches 14 and 24 are set to the a side. This causes the n-type well 21 to be coupled to the power supply circuit 40 via the power supply wiring 41 and the p-type well 11 to be coupled to the ground terminal 44 via the ground wiring 42.

At the time of a return from the stand-by state, a current flows from the p-type well 11 applied with a back bias to the ground terminal 44 via the ground wiring 42 and also from the n-type well 21 to the power supply circuit 40 via the power supply wiring 41. On the p-type well 11 side, negative charges of 2×Cdnw×VBB are required to be discharged and, on the n-type well 21 side, positive charges of (2×Cdnw+Cnw)×VBB are required to be discharged. Namely, more charges are required to be discharged on the n-type well 21 side than on the p-type well 11 side. In the discharge path for discharging to the ground terminal 44, rapid discharging is hampered by parasitic inductance L2 (e.g. up to 10 nH) of the ground wiring 42. The path for discharging to the power supply circuit 40 is hampered by, in addition to the parasitic inductance L2 of the ground wiring 42, the internal impedance R2 of the power supply circuit 40. Normally, the power supply circuit 40 is designed to make the impedance R1 between the external power supply input terminal 43 and the power supply wiring 41 low (e.g., up to about 100Ω), but the impedance R2 between the power supply wiring 41 and the ground terminal 44 is high (e.g., about 1000Ω, or higher). Therefore, in the example for comparison, discharging via the power supply circuit 40 on the n-type well 21 side takes more time than discharging via the ground terminal 44 on the p-type well 11 side.

In the following, an embodiment of the present invention, a working example of the embodiment and a modification example will be described with reference to drawings. In the following description, identical constituent elements will be denoted by identical numerals/symbols and repetitive description of such identical constituent elements may be omitted. Also, in drawings, to make description clear, widths, thicknesses and shapes of various parts may be schematically represented relative to real dimensions and shapes, but such representation being a mere example does not limit interpretation of the present invention.

Figure 30:
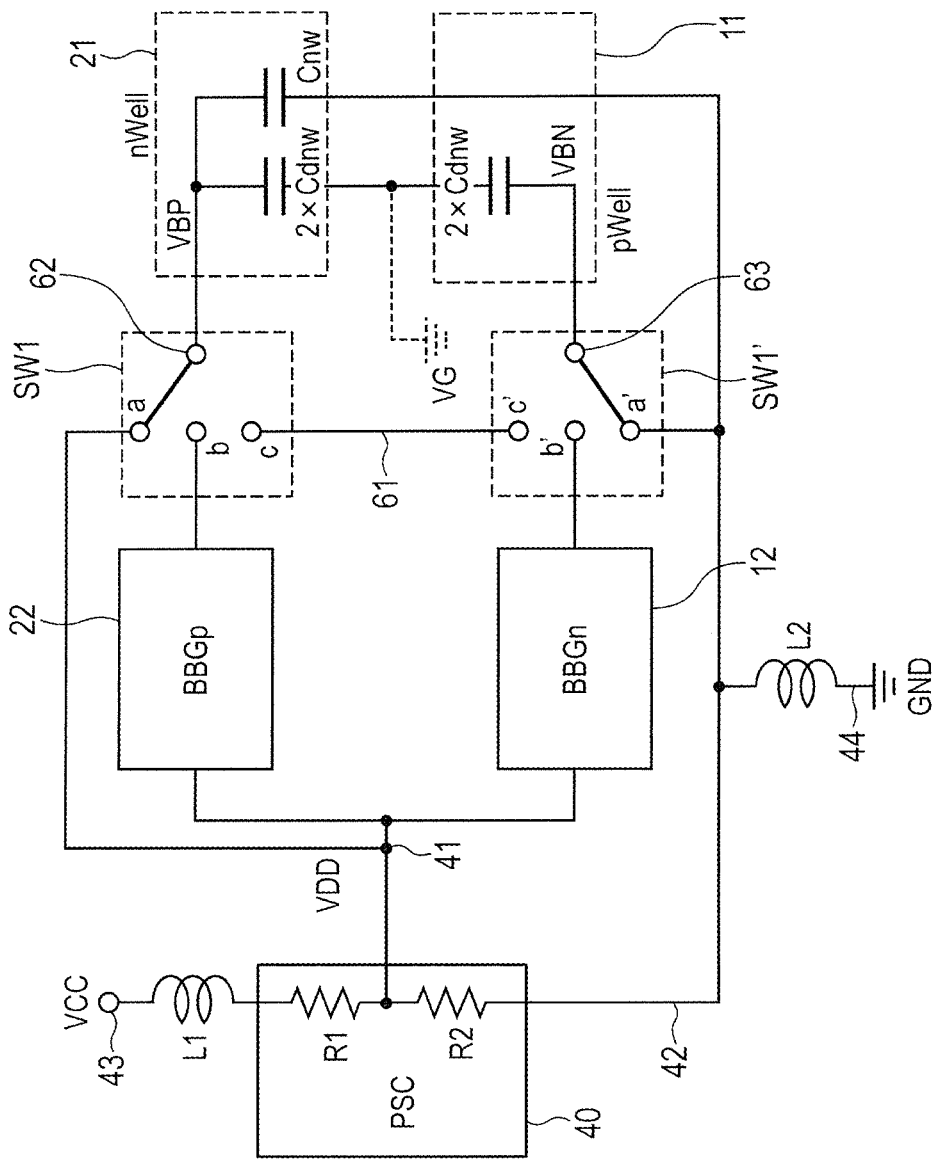
FIG. 30 is a diagram for describing the configuration of a semiconductor device according to an embodiment.

An embodiment of the present invention will be described with reference to FIG. 30. FIG. 30 is a block diagram representing the configuration of a semiconductor device according to the embodiment.

The semiconductor device according to the embodiment includes an n-type well 21 which is, in a stand-by state, applied with a higher voltage than the power supply voltage of the circuit and a p-type well 11 which is, in a stand-by state, applied with a lower voltage than the ground voltage of the circuit. The semiconductor device also includes a well potential switching circuit SW1 for switching the potential supplied to the n-type well 21, a well potential switching circuit SW1' for switching the potential supplied to the p-type well 11, and a path 61 coupling the switching circuit SW1 and the switching circuit SW1'. When the circuit shifts from a stand-by state to an active state, the switching circuit SW1 couples the n-type well 21 to the path 61 and the switching circuit SW1' couples the p-type well 11 to the path 61.

Back biases can be discharged faster by electrically coupling n-type wells and p-type wells than by discharging via the power supply circuit. When doing so, it is preferable to select n-type wells and p-type wells to be electrically coupled such that the n-type wells and the p-type wells are approximately equal in capacitance. It is also preferable to determine, out of the function blocks formed in a semiconductor device, function blocks to be discharged with high priority and other function blocks with low priority for discharging and then couple the n-type wells and p-type wells in the function blocks with high discharge priority whereas making the n-type wells and p-type wells in other function blocks discharge by themselves.

WORKING EXAMPLE

Figure 9:
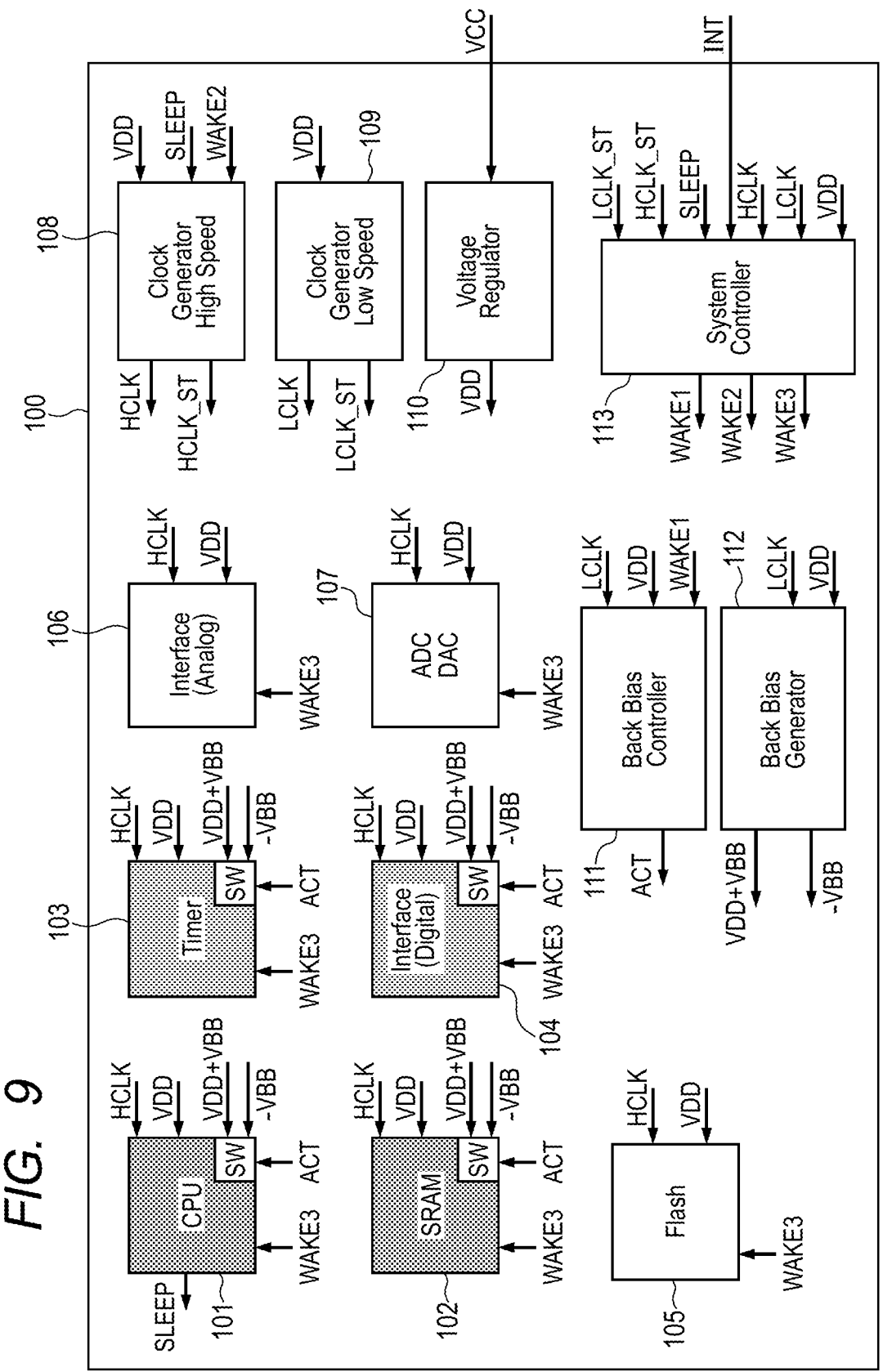
FIG. 9 is a diagram for describing an example microcontroller configuration.

An example of a semiconductor device according to an embodiment of the present invention will be described below. FIG. 9 is a block diagram representing an example microcontroller configuration.

A microcontroller 100 is a semiconductor device formed on a semiconductor chip using CMOS process technology and has a sectional structure similar to those shown in FIGS. 3 and 7. The microcontroller 100 includes such function blocks as a central processing unit (CPU) 101, an SRAM 102 which is a volatile memory, a timer 103 including a counter circuit, and an interface circuit (Interface (Digital)) 104 which is an interface for input from and output to outside. The microcontroller 100 also includes such function blocks as a flash memory (Flash) 105 which is a non-volatile memory, an interface circuit (Interface (Analog)) 106, and an analog/digital conversion circuit (ADC) and a digital/analog conversion circuit (DAC) 107. The microcontroller 100 further includes such function blocks as a high-speed clock generation circuit (Clock Generator High Speed) 108, a low-speed clock generation circuit (Clock Generator Low Speed) 109, and a voltage regulator (Voltage Regulator) 110. Furthermore, the microcontroller 100 includes such function blocks as aback bias control circuit (Back Bias Controller) 111, a back bias generation circuit (Back Bias Generator) 112, and a system control circuit (System Controller) 113. The clock generator high speed 108 generates clocks of, for example, 32 MHz or more and the clock generator low speed 109 generates clocks of about 32 kHz used, for example, as a reference frequency for clocks.

On a chip, the regions to be applied with a back bias are all digital circuits and SRAMs excluding analog circuits, power supply circuits (including back bias generators) and flash memories. Interface circuits (e.g., interface (analog)) 106) which process input from and output to outside the chip using different power supply voltages are applied with no back bias. Namely, in the example shown in FIG. 9, the CPU 101, SRAM 102, timer 103 and interface (digital) 104 are applied with a back bias. In other words, the CPU 101, SRAM 102, timer 103 and interface (digital) 104 are formed in deep n-type wells, respectively. The flash memory (Flash) 105, interface (analog) 106, ADC and DAC 107, clock generator high speed 108, clock generator low speed 109, voltage regulator 110, back bias controller 111, back bias generator 112 and system controller 113 are not applied with any back bias. In other words, the flash memory (Flash) 105, interface (analog) 106, ADC and DAC 107, clock generator high speed 108, clock generator low speed 109, voltage regulator 110, back bias controller 111, back bias generator 112 and system controller 113 are each formed in a deep n-type well different from the deep n-type well where the CPU 101 is formed. In FIG. 9, the switches (SW) represent switches SW1, SW1', SW2, and SW2', being described later, which are formed in the deep n-type well where the CPU 101 is formed.

Figure 10:
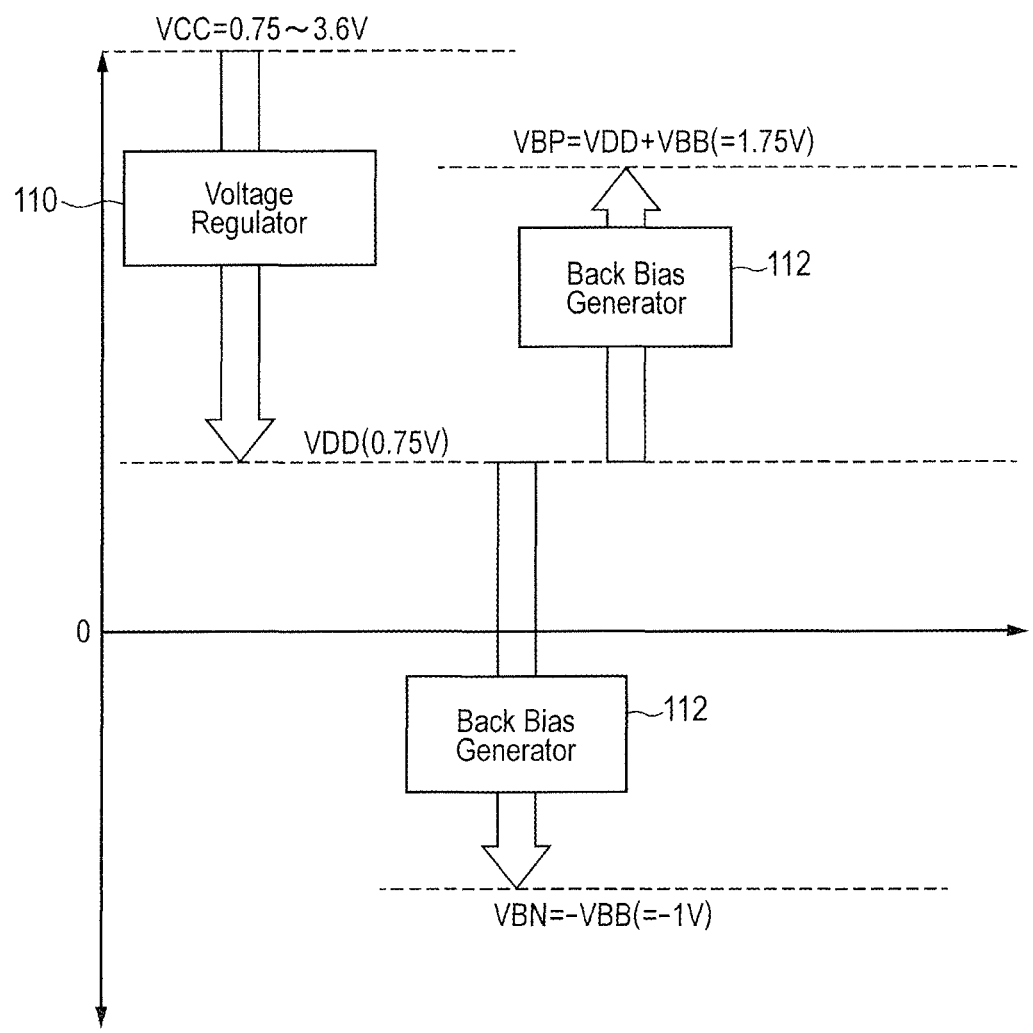
FIG. 10 is a diagram for describing the power supply arrangement of the microcontroller shown in FIG. 9.

Next, the power supply structure of the microcontroller 100 will be described with reference to FIG. 10. FIG. 10 is a conceptual diagram representing the power supply arrangement of the microcontroller shown in FIG. 9.

A power supply voltage (VCC (=0.75 V to 3.6 V)) is inputted from outside the semiconductor chip. At the voltage regulator 110 on the semiconductor chip, a power supply voltage (VDD (=0.75 V)) for digital circuits is generated from VCC. The VDD is supplied to the CPU 101, SRAM 102, and other digital circuits including logic circuits.

Also, using positive and negative charge pumps, being described later, of the back bias generator 112, a back bias (VBP=VDD+VBB (=1.75 V)) for pMOS and a back bias (VBN=−VBB (=−1.0 V)) for nMOS are generated out of the VDD.

When generating the VBN or VBP directly from the VCC, because the VCC voltage has a range, it is necessary to vary the charge pump arrangement such as the number of stages according to the VCC voltage. Hence, the VBN and the VBP are generated from the VDD of a constant value.

Figure 11:
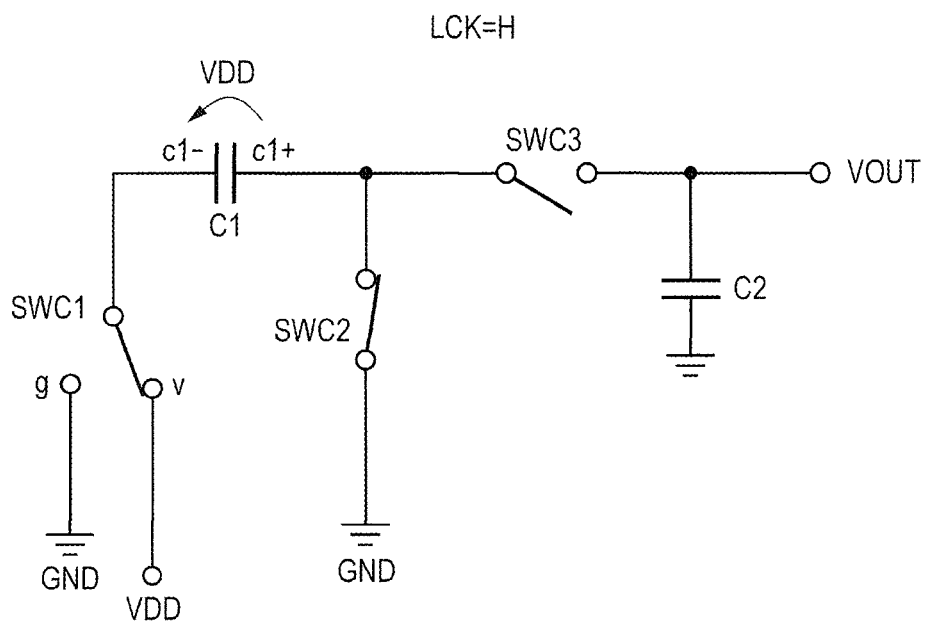
FIG. 11 is a diagram for describing the back bias generator shown in FIG. 9.
Figure 12:
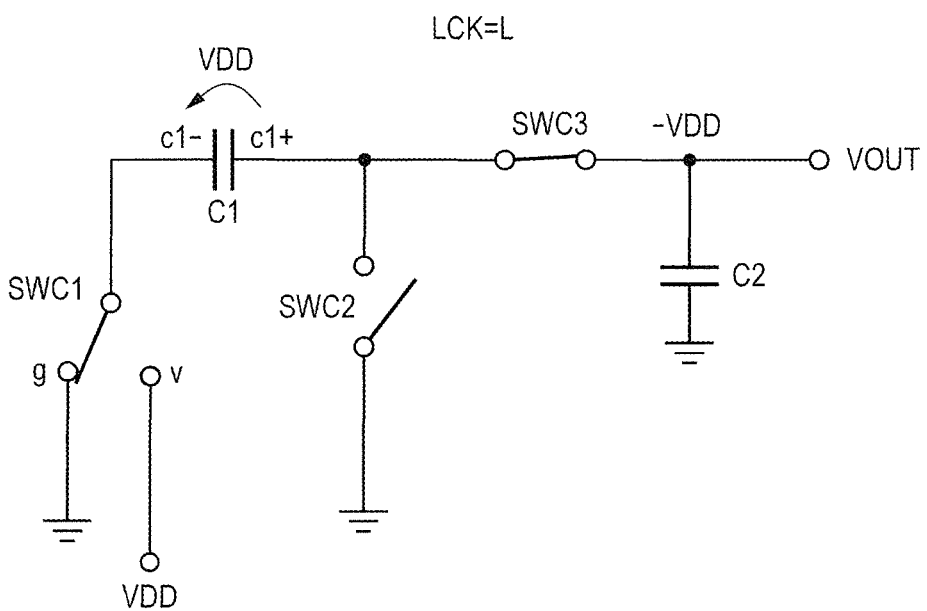
FIG. 12 is a diagram for describing the back bias generator shown in FIG. 9.
Figure 13:
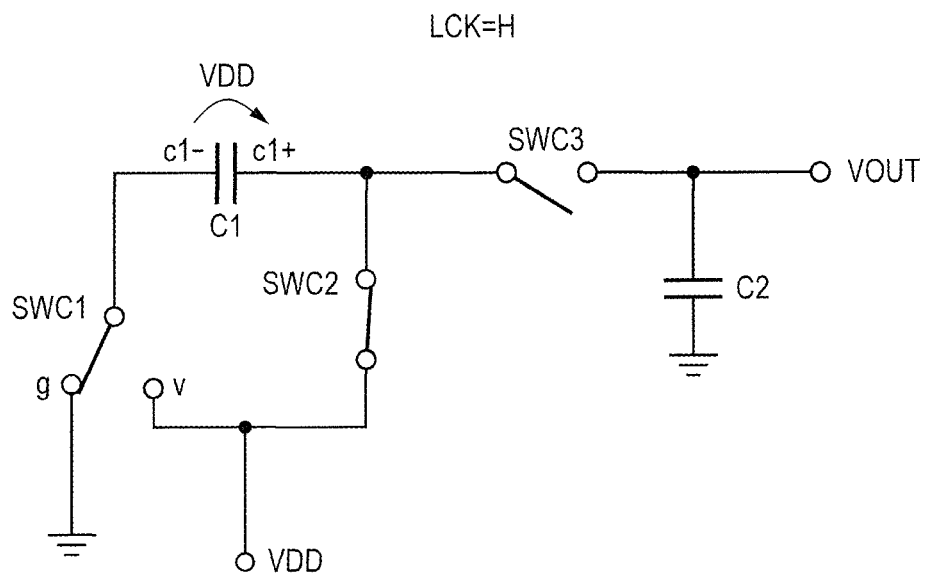
FIG. 13 is a diagram for describing the back bias generator shown in FIG. 9.
Figure 14:
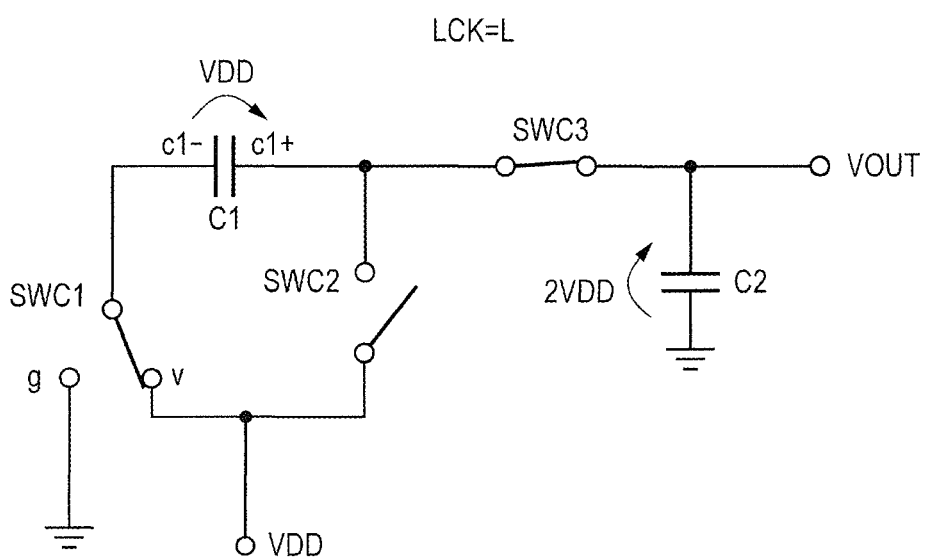
FIG. 14 is a diagram for describing the back bias generator shown in FIG. 9.

Next, with reference to FIGS. 11 to 14, the back bias generator shown in FIG. 9 will be described. FIGS. 11 and 12 are diagrams for describing the configuration and operation of a back bias generator for nMOS, FIG. 11 representing a state with the clock signal at high level and FIG. 12 representing a state with the clock signal at low level. FIGS. 13 and 14 are diagrams for describing the configuration and operation of a back bias generator for pMOS, FIG. 13 representing a state with the clock signal at high level and FIG. 14 representing a state with the clock signal at low level.

The back bias generator 112 includes the BBGn 12 for nMOS and the BBGp 22 for pMOS.

The BBGn 12 for nMOS is a charge pump circuit including capacitors C1 and C2 and switches SWC1, SWC2 and SWC3. Turning on/off of the switches SWC1, SWC2 and SWC3 is controlled by the high level (H) and low level (L) of a low-speed clock signal (LCK).

As shown in FIG. 11, when, with the low-speed clock signal being at high level (LCK=H), the switch SWC1 is set to the v side, the switch SWC2 turns on and the switch SWC 3 turns off, a voltage of VDD is stored between the positive terminal c1+ and the negative terminal c1− of the capacitor c1. In this case, the clock signal used may also be the high-speed clock signal. Next, as shown in FIG. 12, when, with the low-speed clock signal being at low level (LCK=L), the switch SWC1 is set to the g side, the switch SWC2 turns off and the switch SWC 3 turns on, the voltage at the negative terminal c1− of the capacitor C1 becomes 0 V causing the voltage at the positive terminal c1+ of the capacitor C1 to become −VDD. Namely, a voltage of −VDD is generated at the capacitor C2 causing a voltage equaling the input voltage VDD but with a reverse polarity to be outputted as output voltage (VOUT). Subsequently, the operations represented by FIGS. 11 and 12 are alternately repeated. As the same operations are repeated, the voltage generated increasingly lowers from −2×VDD to −3×VDD, . . . . When the charge pump circuit is coupled with a load, the load consumes electric charges and the charge pump voltage rises, but, balancing the electric charges outputted from the charge pump circuit and the electric charges consumed by the load enables the charge pump of −1×VDD to output any voltage in the range of 0 to −1×VDD.

The BBGp 22 is a charge pump circuit including capacitors C1 and C2 and switches SWC1, SWC2 and SWC3. The BBGp 22 for pMOS differs from the BBGn 12 for nMOS as to what the switches SWC1 and SWC2 are coupled with, but the BBGp 22 and the BBGn 12 both have turning on/off of the switches SWC1, SWC2 and SWC3 controlled by the high/low level of the low-speed clock signal.

As shown in FIG. 13, when, with the low-speed clock signal being at high level (LCK=H), the switch SWC1 is set to the g side, the switch SWC2 turns on and the switch SWC 3 turns off, the electric charges collected between the positive terminal c1+ and negative terminal c1− of the capacitor C1 cause the VDD voltage to be stored. Next, as shown in FIG. 14, when, with the low-speed clock signal being at low level (LCK=L), the switch SWC1 is set to the v side, the switch SWC2 turns off and the switch SWC 3 turns on, the voltage at the negative terminal c1− of the capacitor C1 becomes VDD causing the voltage at the positive terminal c1+ of the capacitor C1 to become 2×VDD. Namely, a voltage of 2×VDD is generated at the capacitor C2, so that two times the input voltage VDD is outputted as an output voltage (VOUT). Subsequently, the operations represented by FIGS. 13 and 14 are alternately repeated. As the same operations are repeated, the voltage generated increasingly rises from 3×VDD to 4×VDD, . . . . When the charge pump circuit is coupled with a load, the load consumes electric charges and the charge pump voltage lowers, but, balancing the electric charges outputted from the charge pump circuit and the electric charges consumed by the load enables the charge pump of 2×VDD to output any voltage in the range of 1×VDD to 2×VDD.

Figure 15:
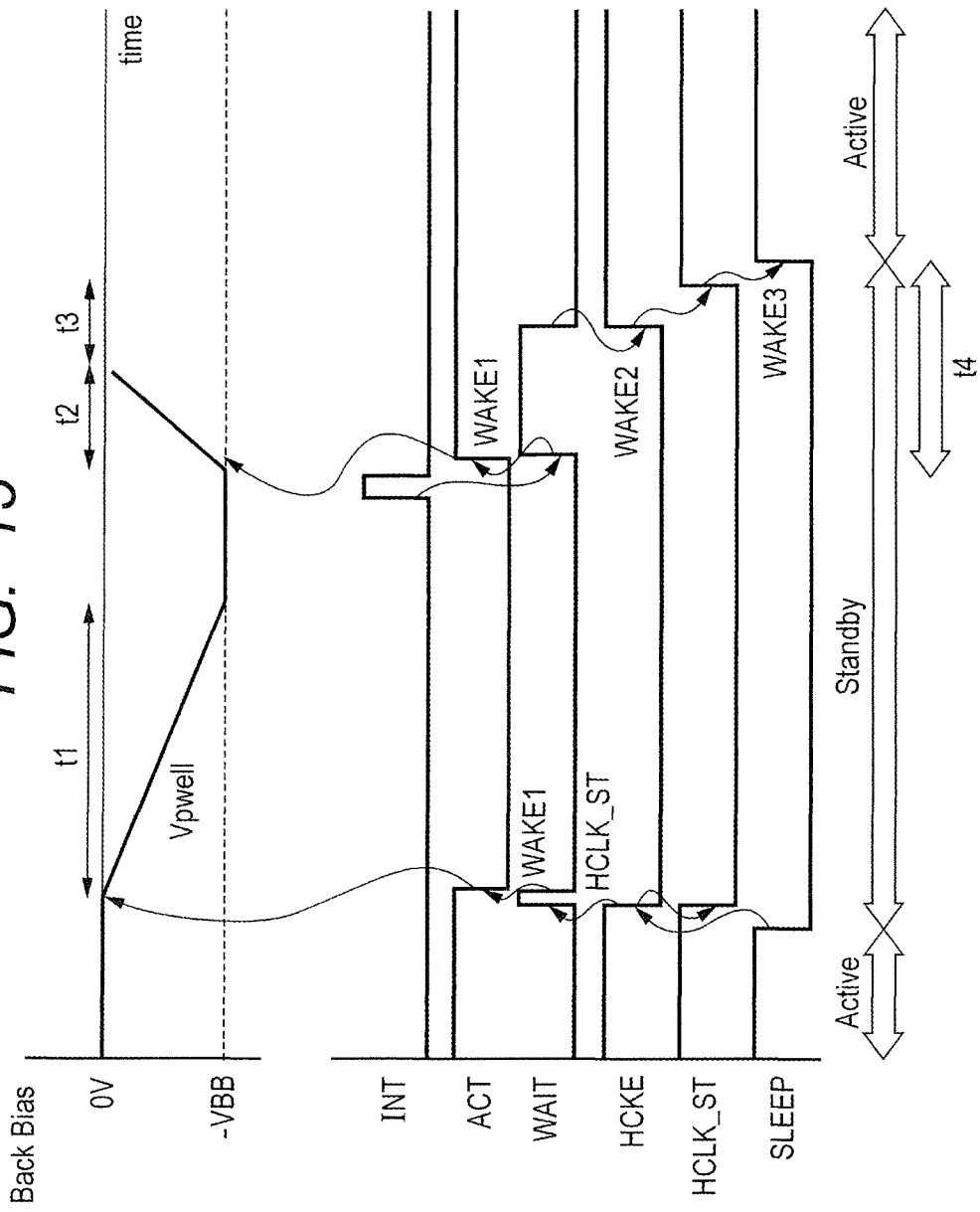
FIG. 15 is a diagram for describing operation timing of the microcontroller shown in FIG. 9.

Next, transition between an active state and a stand-by state will be described with reference to FIG. 15. FIG. 15 is an operation timing diagram of the microcontroller shown in FIG. 9.

A transition from an active state to a stand-by state takes place as follows.

(1) In an active state, the CPU 101 sets a CPU on/off signal (SLEEP signal) to low level (OFF) (activating), for example, by executing an instruction for a low power consumption operation. The clock generator high speed 108 sets the high-speed clock on/off signal (HCKE signal) to low level (OFF) and thereby stops supply of a high-speed clock (HCLK) to, for example, the CPU 101, SRRAM 102 and other logic circuits.

(2) Based on the HCKE signal at low level, the clock generator high speed 108 stops oscillation. At this time, the clock generator low speed 109 continues oscillation. Also, based on the HCKE signal at low level, the clock generator high speed 108 sets a clock stabilization signal (HCLK_ST signal) to low level (deactivating). Also, based on the HCLK_ST signal at low level, the system controller 113 sets a WAIT signal to high level and, after elapse of a predetermined period of time, deactivates a WAKE1 signal by setting the WAIT signal to low level. With the WAKE1 signal deactivated, the back bias controller 111 sets the back bias on/off signal (ACT signal) to low level.

(3) Out of the blocks to which supply of the high-speed clock (HCLK) has been stopped based on the ACT signal at low level, the predetermined blocks (CPU 101, SRAM 102, timer 103, interface circuit) are applied with back biases (VDD+VBB, −VBB).

A return to an active state by an interrupt takes place as follows.

(1) An interrupt signal (INT signal) is generated in a circuit in an active state outside or inside the semiconductor chip.
(2) Based on the INT signal at high level (activated), the system controller 113 sets the WAIT signal to high level and thereby activates the WAKE1 signal. The back bias controller 111 sets the ACT signal to high level based on the activated WAKE1 signal. Based on the ACT signal at high level, back bias application to, out of the blocks to which the high-speed clock (HCLK) is supplied, the predetermined blocks (CPU 101, SRAM 102, timer 103, interface circuit) is stopped and their well potentials are returned to the power supply potential or ground potential.
(3) When a predetermined period of time (time adequate for a transition of the back bias potential) elapses after activation of the INT signal, the system controller 113 sets the WAIT signal to low level and thereby activates the WAKE2 signal.
(4) Based on the activation of the WAKE2 signal, the clock generator high speed 108 starts oscillation.
(5) When the oscillation by the clock generator high speed 108 is stabilized, the clock generator high speed 108 sets the HCLK_ST signal to high level.
(6) Based on the HCLK_ST signal at high level, the system controller 113 activates the WAKE3 signal and thereby sets the SLEEP signal to high level. As a result, the high-speed clock (HCLK) starts being supplied to the CPU 101, SRAM 102 and other logic circuits and interrupt processing is performed.

Figure 16:
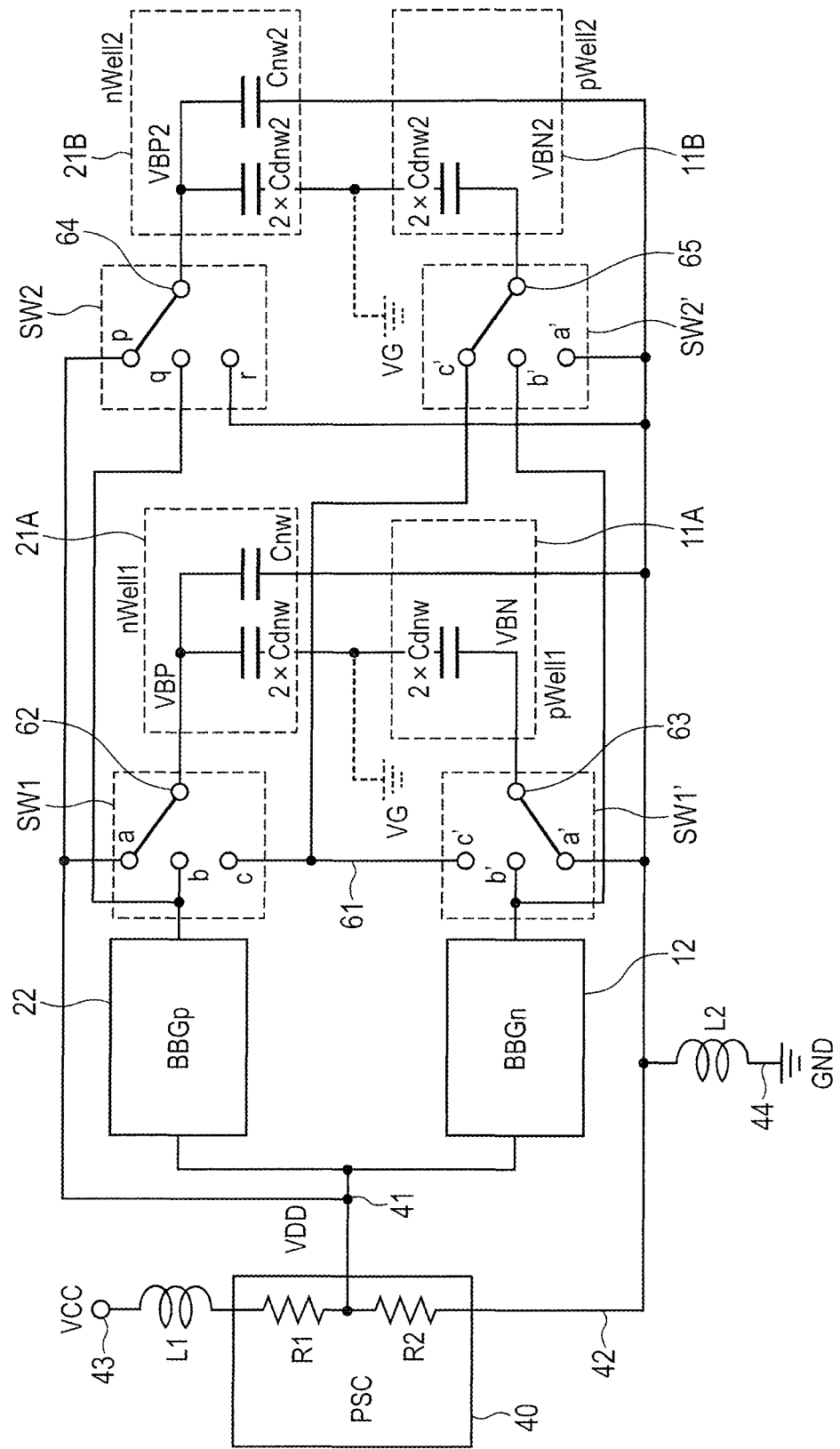
FIG. 16 is a diagram for describing back bias control performed by the microcontroller shown in FIG. 9.
Figure 17:
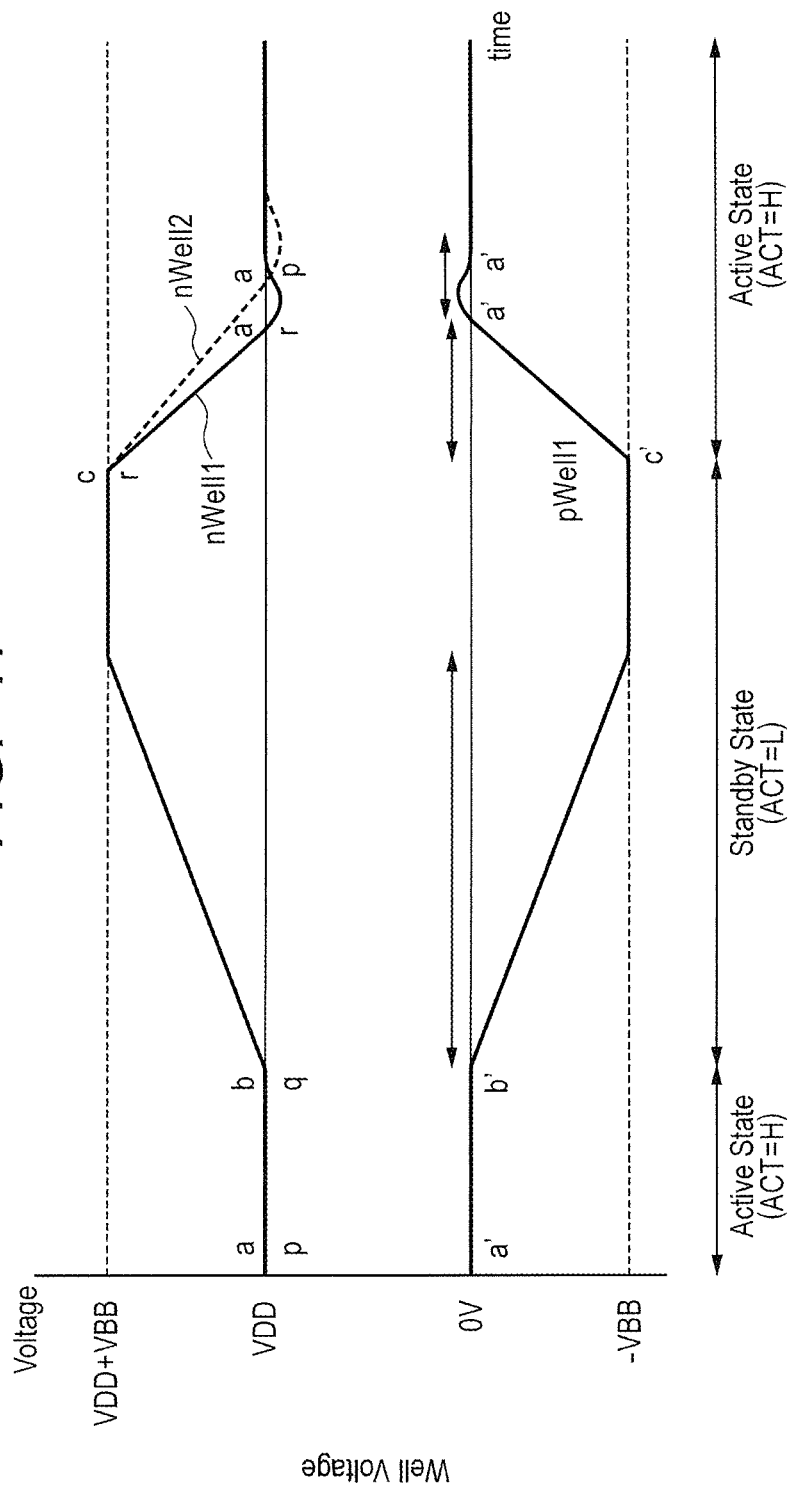
FIG. 17 is a diagram for describing operation timing for back bias control described based on FIG. 16.

Next, back bias control performed by the microcontroller shown in FIG. 9 will be described with reference to FIGS. 16 and 17. FIG. 16 is a block diagram of a back bias controller including the back bias generator of the microcontroller shown in FIG. 9. FIG. 17 shows operation timing of the back bias controller shown in FIG. 16.

The power supply circuit (PSC) 40, the back bias generator (BBGn) 12 for nMOS and the back bias generator (BBGp) 22 for pMOS are the same as those included in the example for comparison. The power supply circuit 40 shown in FIG. 16 is the same as the voltage regulator 110 shown in FIG. 9.

In a circuit in which the well potential is varied between an operating state (active state) and a waiting state (stand-by state), the p-type wells for nMOS include the first p-type well region (p-well 1) 11A and the second p-type well region (p-well 2) 11B that are coupled to a path 61 electrically coupling the p-type wells and the n-type wells. The n-type wells for pMOS include the first n-type well region (n-well 1) 21A coupled to the path 61 electrically coupling the p-type wells and the n-type wells and the second n-type well region (n-well 2) 21B not coupled to the path 61.

The first n-type well region 21A, second n-type well region 21B, first p-type well region 11A and second p-type well region 11B are respectively coupled with well supply potential switching circuits (switches) SW1, SW2, SW1' and SW2' for switching the well potentials to be supplied to the respective wells.

The wells are to be disposed to minimize the difference between the capacitance of the first n-type well region 21A and the total capacitance of the first p-type well region 11A and the second p-type well region 11B. The capacitance of the first n-type well region 21A and the total capacitance of the first p-type well region 11A and the second p-type well region 11B are preferably equalized, but there may be a difference of up to about ±20% between them. When, as shown in FIGS. 3 and 7, deep n-type wells are formed in a p-type substrate, the total capacitance of the n-type wells becomes larger than the total capacitance of the p-type wells. Hence, the second n-type well region (nWell2) 21B is not coupled to the path 61. In FIG. 16, the voltages of the first n-type well region 21A, the first p-type well region 11A, the second n-type well region 21B and the second p-type well region 11B are respectively denoted as "VBP", "VBN", "VBP2" and "VBN2".

The control operation of the circuit shown in FIG. 16 will be described with reference to FIG. 17.

(1) In the period of an initial active state, the potential of each of the first n-type well region 21A and the second n-type well region 21B is equalized with the power supply potential (VDD) and the potential of each of the first p-type well-region 11A and the second p-type well region 11B is equalized with the ground potential (GND). At this time, the position of the switch SW1 is on the a side and the position of each of the switches SW1' and SW2' is on the a' side, and the position of the switch SW2 is on the p side.

(2) For a transition to a stand-by state, the SW1 is set to the b side, the switches SW1' and SW2' are each set to the b' side, and the switch SW2 is set to the q side. As a result, the first n-type well region 21A and the second n-type well region 21B are coupled to the back bias generator for pMOS (BBGp) 22. This increases the potential of each of the first and second n-type well regions to (VDD+VBB) to be higher than the power supply potential (VDD). At the same time, the first p-type well region 11A and the second p-type well region 11B are coupled to the back bias generator for nMOS (BBGn) 12. This decreases the potential of each of the first and second p-type well regions to −VBB to be lower than the ground potential (GND).

(3) For a transition from a stand-by state to an active state, the switch SW1 is set to the c side, the switches SW1' and SW2' are each set to the c' side, and the switch SW2 is set to the r side. This couples the first p-type well region 11A, the second p-type well region 11B and the first n-type well region 21A to the path 6a and, thereby, neutralizes the electric charges of the well regions. As a result, the potential (VBP) of the first n-type well region 21A lowers and the potential (VBN) of the first p-type well region 11A and the potential (VBN2) of the second p-type well region 11B rise. At the same time, the second n-type well region 21B is coupled to the ground terminal 44 via the ground wiring 42. The length of the path 61 coupling the first p-type well region 11A, the second p-type well region 11B and the first n-type well region 21A is short and only includes the on resistances of the switches SW1, SW1' and SW2'. The resistances can be made as small as several ohms on the chip, so that the electric charges can be neutralized at high speed without being hindered by the output impedance and wiring inductance of the power supply circuit 40.

(4) When the potential (VBP) of the first n-type well region 21A nears VDD or when the potential (VBN) of the first p-type well region 11A and the potential (VBN2) of the second p-type well region 11B near GND, the switch SW1 is set to the a side and the switches SW1' and SW2' are each set to the a' side whereas the switch SW2 is left positioned on the r side. This decouples the path 61, couples the first n-type well region 21A to the power supply circuit 40 via the power supply wiring 41 and couples the first n-type well region 21A and the second p-type well region 11B to the ground terminal 44 via the ground wiring 42.

(5) Furthermore, when the potential of the second n-type well region 21B nears VDD, the switch SW2 is set to the p side. This also couples the second n-type well region 21B to the power supply circuit 40 via the power supply wiring 41. With the second n-type well region 21B coupled to the power supply circuit 40, discharging of the second n-type well region 21B is delayed by being affected by the impedance of the power supply circuit 40. These operations (4) and (5) require to be performed at high speed while monitoring the potentials of the wells.

Figure 18:
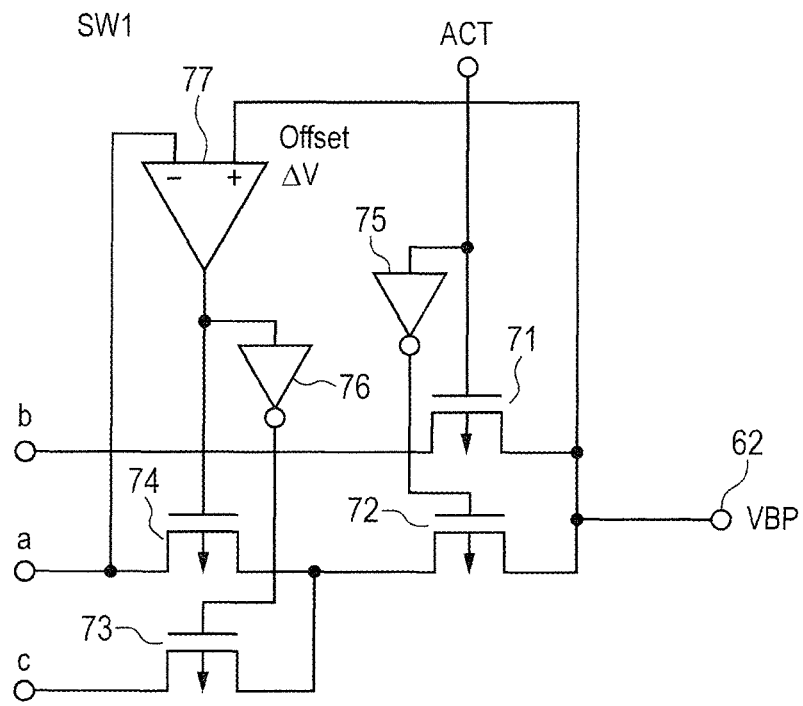
FIG. 18 is a diagram for describing a switching circuit, shown in FIG. 16, for switching a well potential to be supplied.
Figure 19:
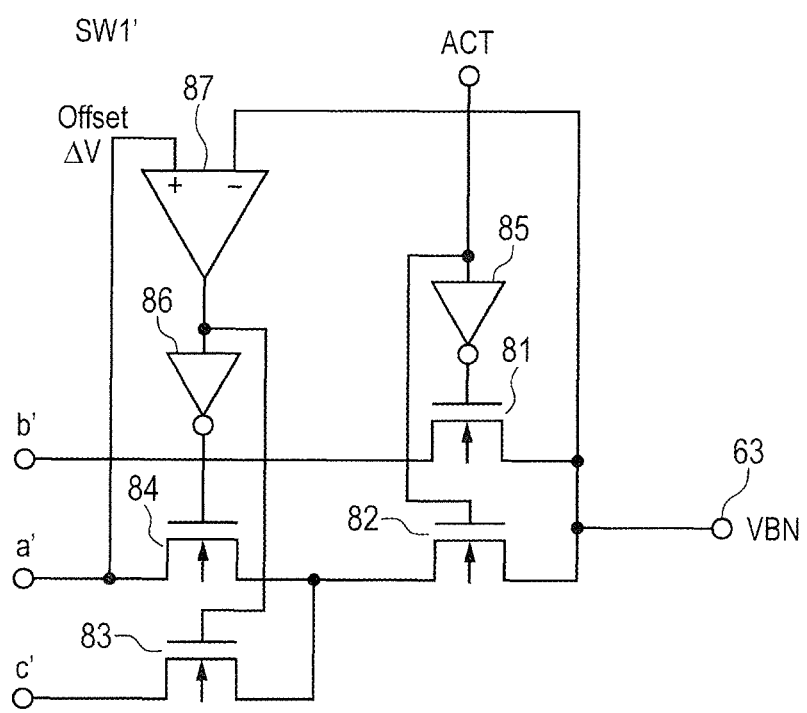
FIG. 19 is a diagram for describing a switching circuit, shown in FIG. 16, for switching a well potential to be supplied.
Figure 20:
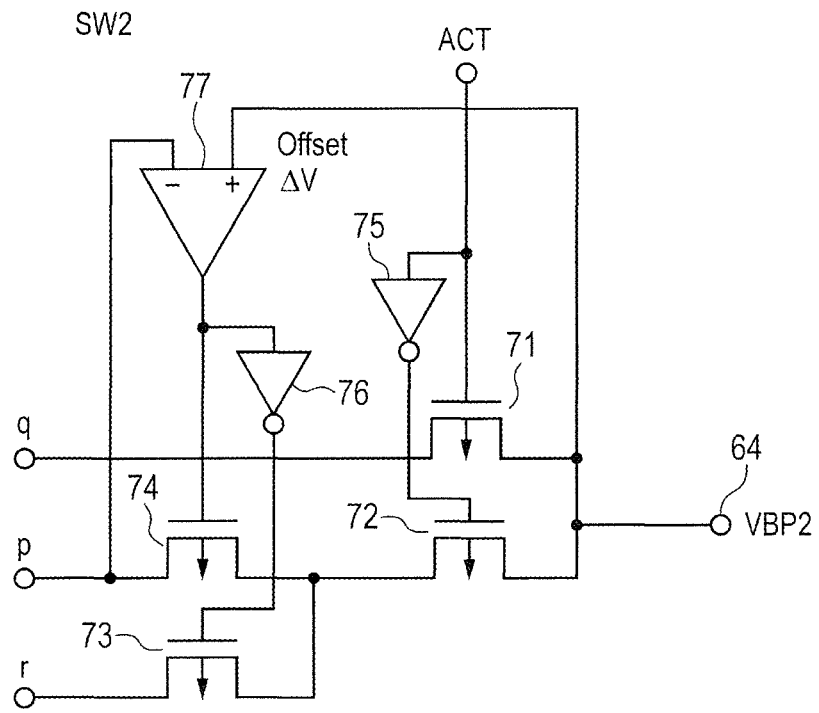
FIG. 20 is a diagram for describing a switching circuit, shown in FIG. 16, for switching a well potential to be supplied.
Figure 21:
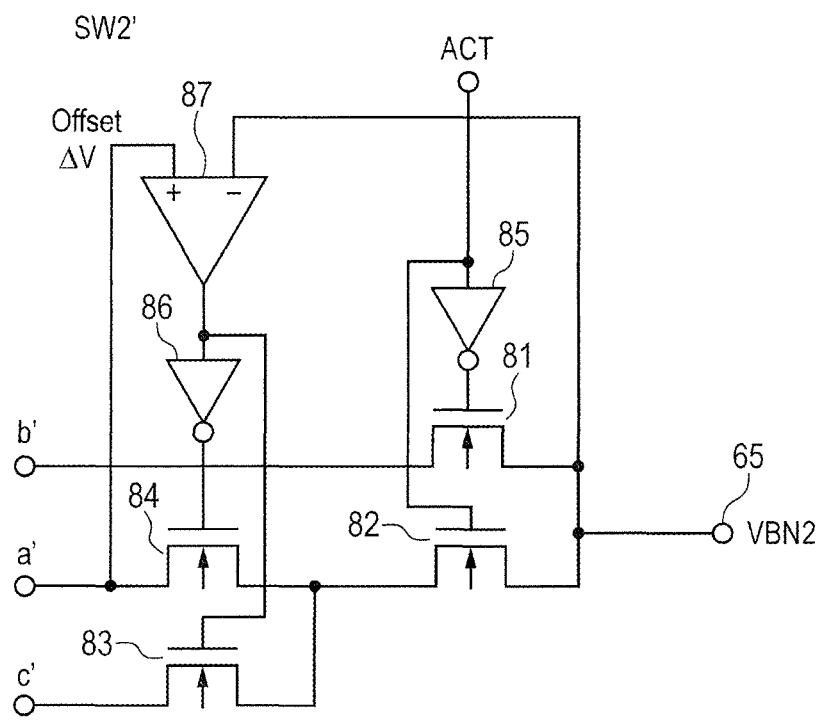
FIG. 21 is a diagram for describing a switching circuit, shown in FIG. 16, for switching a well potential to be supplied.

Next, bias switching circuits for switching biases while monitoring the potentials of the wells will be described with reference to FIGS. 18 to 21. FIG. 18 is a circuit diagram of the switch SW1. FIG. 19 is a circuit diagram of the switch SW1'. FIG. 20 is a circuit diagram of the switch SW2. FIG. 21 is a circuit diagram of the SW2'. The control signal (ACT signal) from outside is set to high level (H) in an active state and is set to low level (L) in a stand-by state. The switches SW1, SW1', SW2 and SW2' are each formed in a region to be applied with a back bias and are each denoted as "SW" in FIG. 9.

As shown in FIG. 18, in a stand-by state, the switch SW1 couples, using a pMOS 71, a terminal 62 coupled to the first n-type well region 21A to the b side, that is, to the BBGp 22 for pMOS. In an active state, the destination of coupling of the terminal 62 of the switch SW1 depends on the comparison between the potential (VBP) of the terminal 62 and the power supply potential (VDD). When VBP>VDD, the terminal 62 is, by a pMOS 72 coupled to an inverter 75 and a pMOS 73 coupled to an inverter 76, coupled to the path 61 on the c side. When VBP<VDD, the terminal 62 is, by the pMOS 72 and a pMOS 74, coupled to the power supply circuit 40 via the power supply wiring 41 on the a side. In this case, a comparator 77 for voltage comparison preferably has an offset between its inputs. With an offset of ΔV provided, the coupling destination of the terminal 62 changes when VBP=VDD+ΔV. The ΔV is, for example, about 50 mV. In this way, the incidence of VBP becoming lower than VDD due to a comparator response delay can be reduced.

As shown in FIG. 19, in a stand-by state, the switch SW1' couples, using an nMOS 81, a terminal 63 coupled to the first p-type well region 11A to the b' side, that is, to the BBGn 12 for nMOS. In an active state, the destination of coupling of the terminal 63 of the switch SW1' depends on the comparison between the potential (VBN) of the terminal 63 and the ground potential (GND). When VBN<GND, the terminal 63 is, by an nMOS 82 and an nMOS 83, coupled to the path 61 on the c' side. When VBN>GND, the terminal 63 is, by the nMOS 82 and an nMOS 84 coupled to an inverter 86, coupled to the ground terminal 44 via the ground wiring 42 on the a' side. In this case, too, a comparator 87 for voltage comparison preferably has an offset between its inputs. In this way, the incidence of VBN becoming higher than GND due to a comparator response delay can be reduced.

As shown in FIG. 20, in a stand-by state, the switch SW2 couples, using the pMOS 71, a terminal 64 coupled to the second n-type well region 21B to the q side, that is, to the BBGp 22 for pMOS. In an active state, the destination of coupling of the terminal 64 of the switch SW2 depends on the comparison between the potential (VBP2) of the terminal 64 and the power supply potential (VDD). When VBP2>VDD, the terminal 64 is, by the pMOS 72 coupled to the inverter 75 and the pMOS 73 coupled to the inverter 76, coupled to the ground terminal 44 via the ground wiring 42 on the r side. When VBP2<VDD, the terminal 64 is, by the pMOS 72 and the pMOS 74, coupled to the power supply circuit 40 via the power supply wiring 41 on the p side. In this case, too, the comparator 77 for voltage comparison preferably has an offset between its inputs. In this way, the incidence of VBP2 becoming lower than VDD due to a comparator response delay can be reduced.

As shown in FIG. 21, in a stand-by state, the switch SW2' couples, using the nMOS 81 coupled to an inverter 85, a terminal 65 coupled to the second p-type well region 11B to the b' side, that is, to the BBGn 12 for nMOS. In an active state, the destination of coupling of the terminal 65 of the switch SW2' depends on the comparison between the potential (VBN2) of the terminal 65 and the ground potential (GND). When VBN2<GND, the terminal 65 is, by the nMOS 82 and the nMOS 83, coupled to the path 61 on the c' side. When VBN2>GND, the terminal 65 is, by the nMOS 82 and the nMOS 84 coupled to the inverter 86, coupled to the ground terminal 44 via the ground wiring 42 on the a' side. In this case, too, the comparator 87 for voltage comparison preferably has an offset between its inputs. In this way, the incidence of VBN becoming higher than GND due to a comparator response delay can be reduced.

Figure 22:
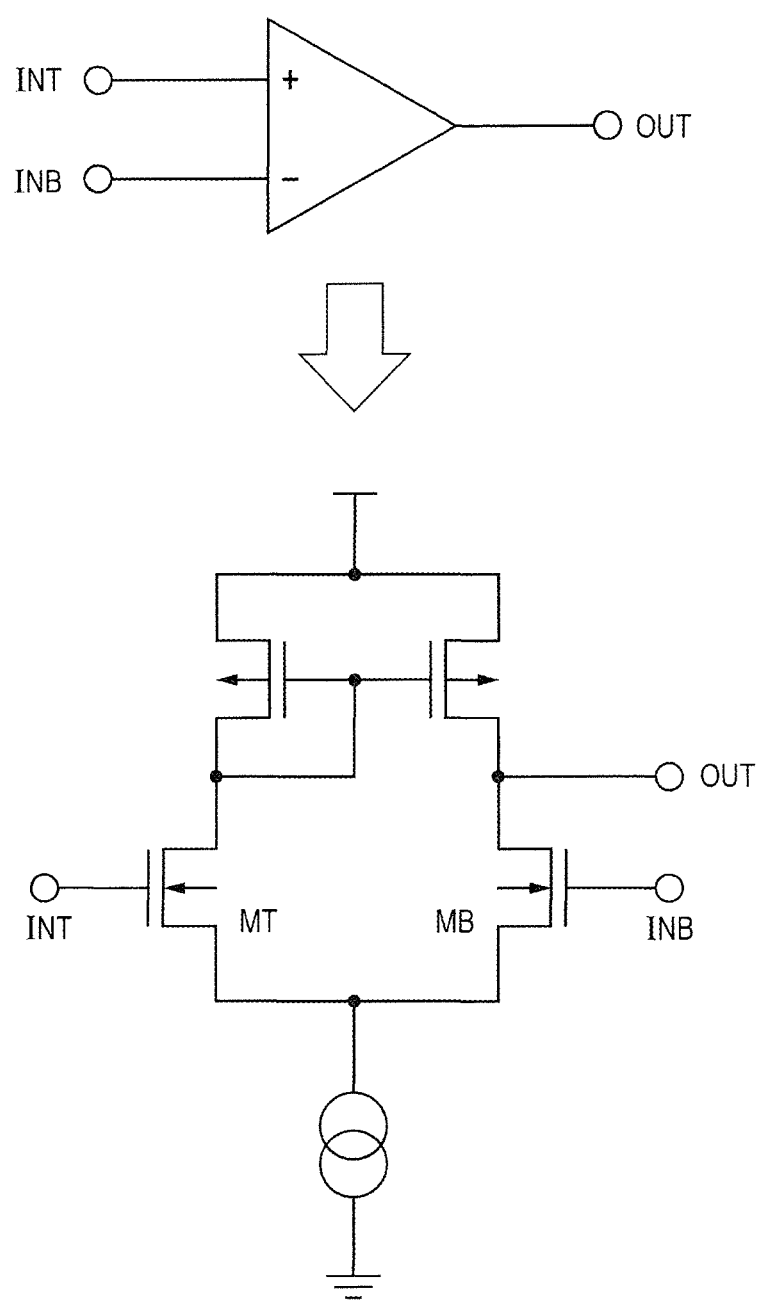
FIG. 22 is a diagram for describing comparators shown in FIGS. 18 to 21.
Figure 23:
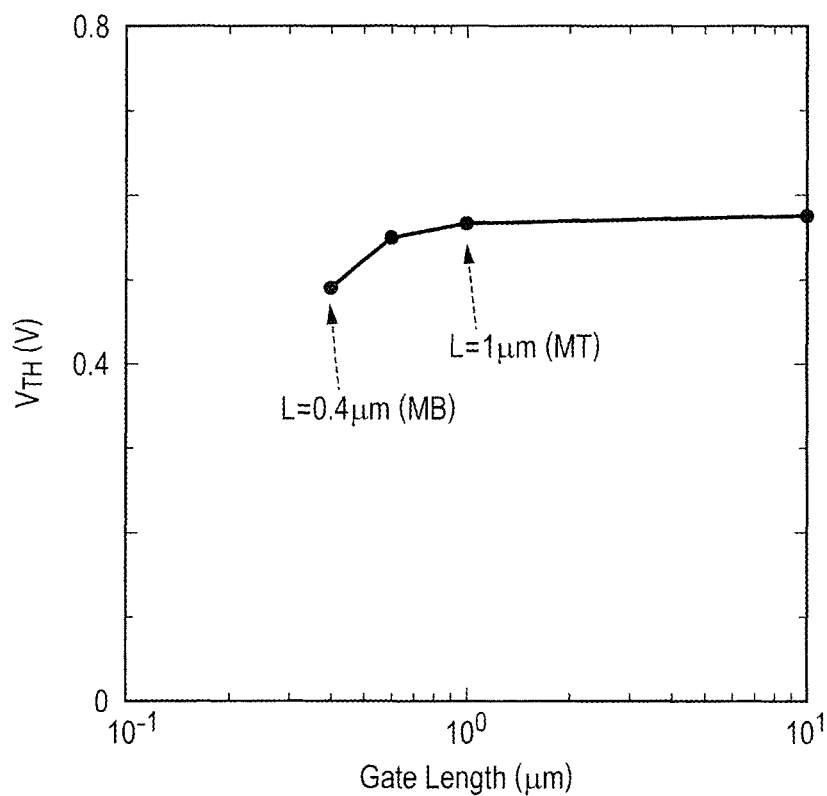
FIG. 23 is a diagram for describing the comparator shown in FIG. 22.

The comparators used in the bias switching circuits will be described with reference to FIGS. 22 and 23. FIG. 22 is a comparator circuit diagram. FIG. 23 is a chart representing the relationship between gate length and threshold voltage.

As shown in FIG. 22, the comparators 77 and 87 each include a differential pair and an active-load current mirror. To provide an input voltage offset between a non-inverting input terminal INT and an inverting input terminal INB, the MOSFET gate length is made different between a transistor MT on the non-inverting input terminal side and a transistor MB on the inverting input terminal INB side.

As shown in FIG. 23, generally, a MOSFET with a longer gate length has a higher threshold. For example, when the gate length on the transistor MT side is 1 μm and the gate length on the transistor MB side is 0.4 μm, the threshold difference between the two transistors is about 50 mV, so that the threshold on the non-inverting input terminal INT side can be made about 50 mV higher than the threshold on the inverting input terminal INB side.

Figure 24:
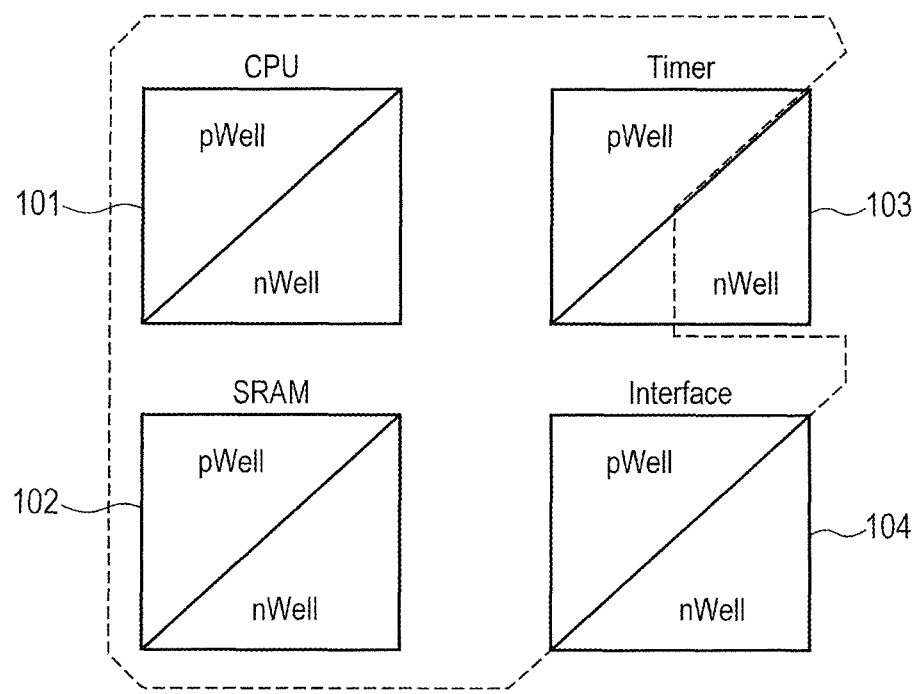
FIG. 24 is a diagram for describing back bias control for individual function blocks shown in FIG. 9.

As described above, the n-type well regions include those coupled to the path 61 and others not coupled to the path 61. How to choose the two types of the regions will be described with reference to FIG. 24. FIG. 24 is a diagram for describing bias control for individual function blocks of the microcontroller shown in FIG. 9. Generally, when deep n-type wells are formed, the total capacitance of all n-type wells included in each function block is larger than the total capacitance of all p-type wells included in each function block. Also, generally, when deep p-type wells are formed, the total capacitance of all p-type wells included in each function block is larger than the total capacitance of all n-type wells included in each function block. Hence, the function blocks included in a semiconductor chip are prioritized for substrate bias control and both the n-type wells and p-type wells of high-priority function blocks are coupled to a direct coupling path, whereas only either the n-type wells or the p-type wells of low-priority function blocks are entirely coupled to the path 61 with the other wells that may be the n-type wells or p-type wells left without being entirely coupled to the path 61. In this way, the total capacitance of the n-type wells coupled to the path 61 and the total capacitance of the p-type wells coupled to the path 61 can be equalized. For example, the first n-type well region 21A and the first p-type well region 11A are included in a high-priority function block, whereas the second n-type well region 21B and the second p-type well region 11B are included in a low-priority function block.

Referring to FIG. 24, the CPU 101 and the SRAM 102 are made high-priority function blocks, so that both the n-type well and the p-type well of each of the CPU 101 and the SRAM 102 are coupled to the path 61. The timer 103 and the interface (digital) 104 are made low-priority function blocks and only the p-type wells and a portion of an n-type well of the low-priority function blocks are coupled to the path 61, whereas the remaining n-type well is not coupled to the path 61. When an n-type well and a p-type well are electrically coupled, they can be discharged, that is, VBP can be lowered, faster than when the n-type well and the p-type well are not electrically coupled, that is, faster than VBP2 can be lowered. In other words, the wells included in the high-priority function blocks CPU 101 and SRAM 102 can be discharged at high speed.

According to the present working example, the p-type wells formed in nMOS transistors and n-type wells formed in pMOS transistors include those which are discharged without using any power supply or ground. This enables fast discharging without being affected by power supply impedance or ground impedance, so that a transition from a stand-by state to an active state can be made faster.

MODIFICATION EXAMPLE

A typical modification example of the above working example will be described in the following. In the following description of the modification example, parts having structures and functions similar to those described in connection with the foregoing working example may be denoted by numerals and symbols similar to those used in connection with the foregoing working example. In describing such parts, corresponding descriptions made in connection with the foregoing working example may be applied as appropriate without being technically inconsistent. Also, portions of the foregoing working example and a whole or portions of the modification example may be combined for application as appropriate without being technically inconsistent.

Figure 25:
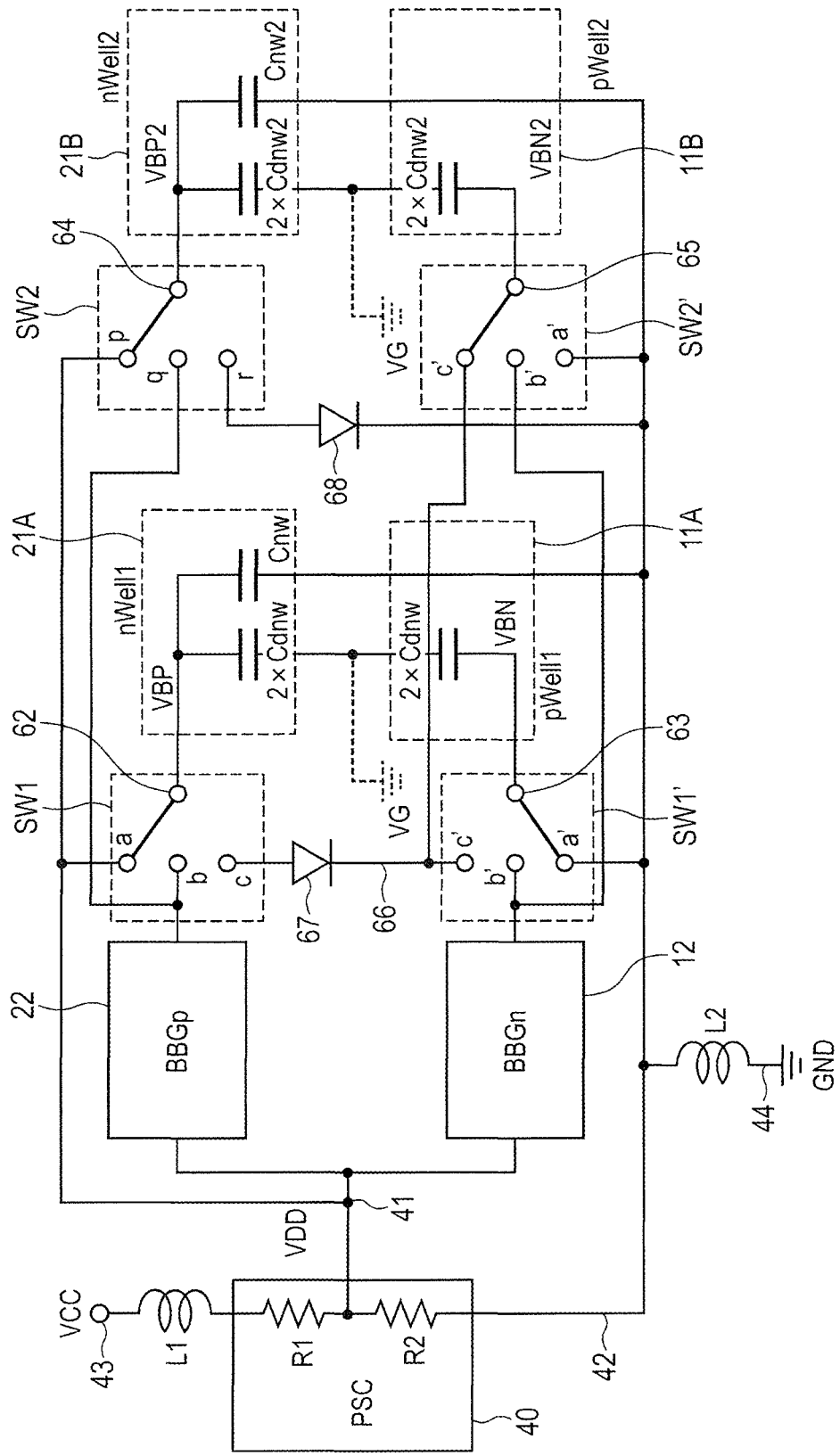
FIG. 25 is a diagram for describing back bias control according to a modification example.

FIG. 25 is a block diagram of a back bias controller including a back bias generator according to the modification example.

According to the modification example, a diode 67 is inserted between the first n-type well region 21A and the path 66 coupling the first p-type well region 11A and the second p-type well region 11B. Also, a diode 68 is inserted between the second n-type well region 21B and the ground wiring 42. In other respects, the circuit arrangement is the same between the modification example and the foregoing working example.

With the above circuit arrangement according to the modification example, the electric charge transfers between the first n-type well region 21A and the first p-type well region 11A and between the first n-type well region 21A and the second p-type well region 11B stop when the potential difference between the corresponding well regions equals the threshold of the corresponding diode. Referring to FIGS. 18, 19, 20 and 21 for the foregoing working example, the timing of turning off the path 61 is determined by the comparator 77 and, even when a response of the comparator 77 is delayed, the potential difference between the first n-type well region 21A and the first p-type well region 11A and the potential difference between the first n-type well region 21A and the second p-type well region 11B do not come excessively close. Also, the potential of the second n-type well region 21B does not drop to GND, either. Therefore, the low-power, slow-response comparator is usable.

Figure 26:
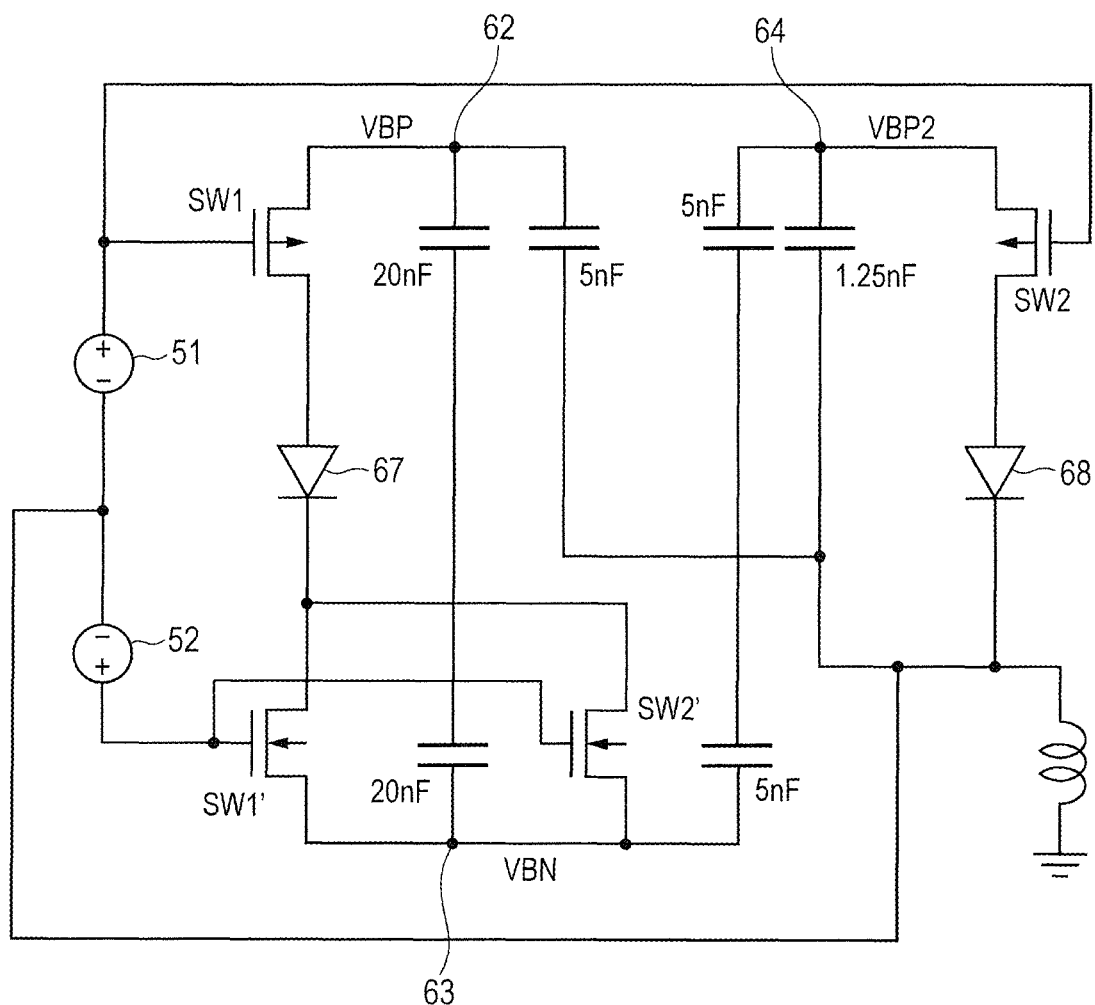
FIG. 26 shows a circuit for simulating back bias control described based on FIG. 25.
Figure 27:
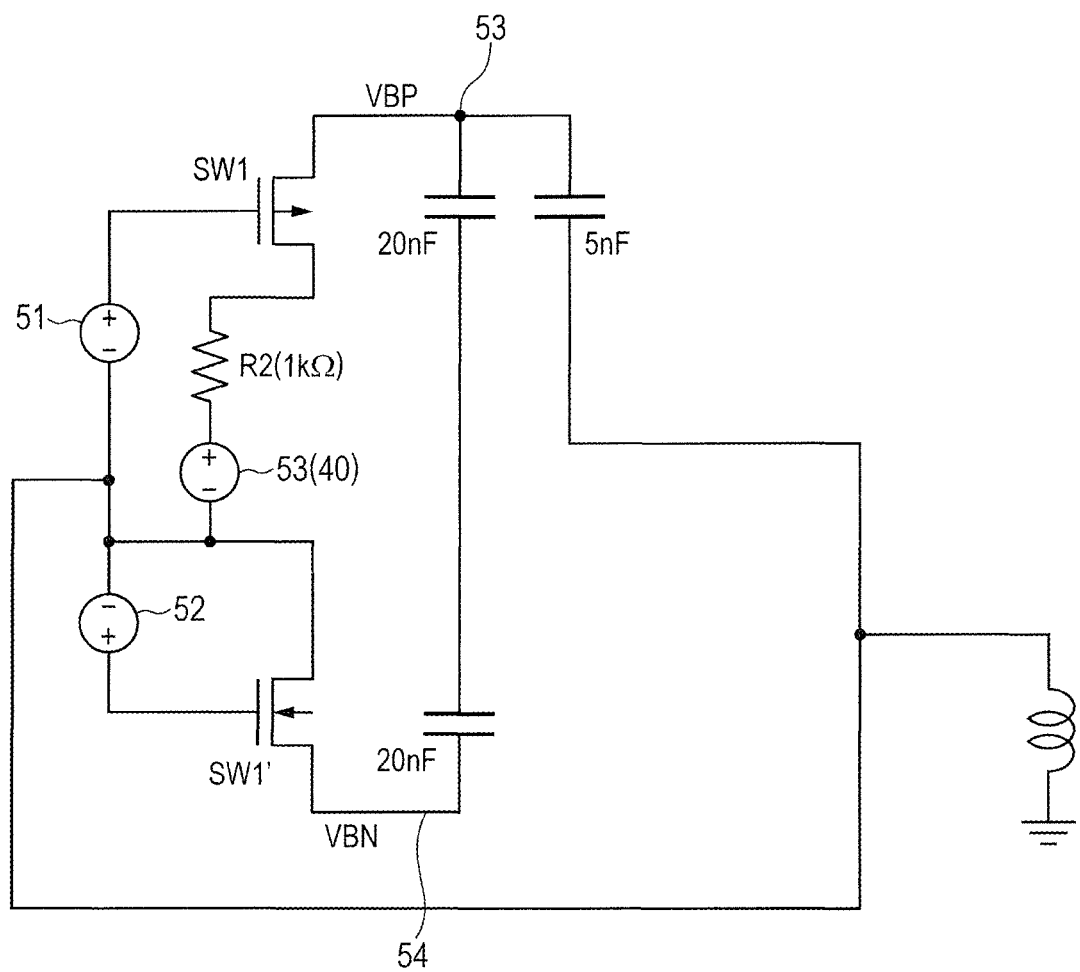
FIG. 27 shows a circuit for simulating back bias control described based on FIG. 8.
Figure 28:
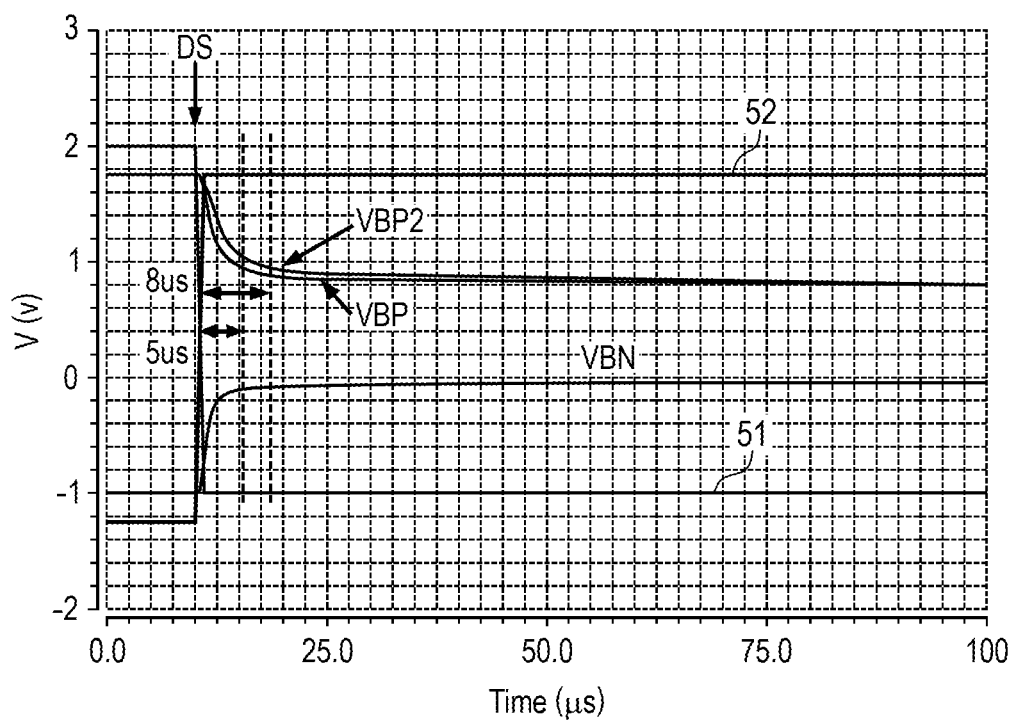
FIG. 28 is a diagram for describing simulation results obtained using the simulation circuit shown in FIG. 26.
Figure 29:
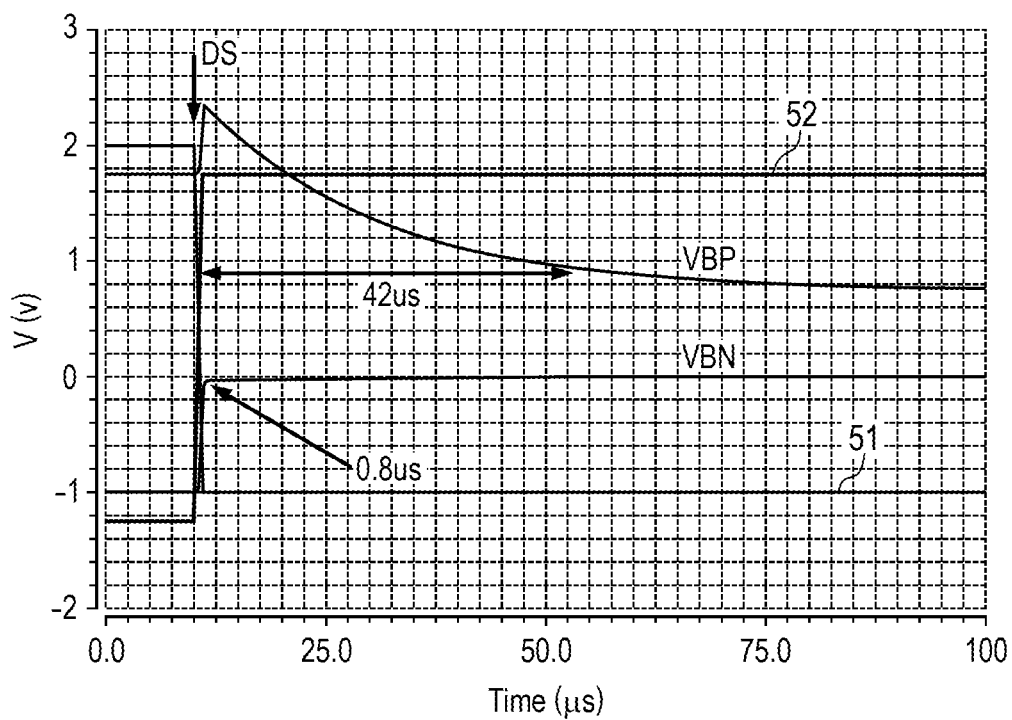
FIG. 29 is a diagram for describing simulation results obtained using the simulation circuit shown in FIG. 27.

Next, effects of the modification example will be described with reference to FIGS. 26 to 29. FIG. 26 is a simulation circuit diagram based on the circuit shown in FIG. 25. FIG. 27 is a simulation circuit diagram based on the circuit shown in FIG. 8. FIG. 28 shows simulation waveforms obtained from the circuit shown in FIG. 26. FIG. 29 shows simulation waveforms obtained from the circuit shown in FIG. 27.

Referring to FIGS. 26 and 27, the switches SW1 and SW2 are each comprised of a pMOS and the switches SW1' and SW2' are each comprised of an nMOS. Voltage supplies 51 and 52 are coupled to the gates of the switches SW1 and SW2 and the gates of the switches SW1' and SW2', respectively, to control turning on/off of the respective switches. The voltage supply 51 is a control signal for the switches SW1 and SW2. The voltage supply 52 is a control signal for the switches SW1' and SW2'. The substrate capacitance values assumed are Cdnw=10 nF, Cnw=5 nF, Cdnw2=2.5 nF, and Cnw2=1.25 nF. The power supply circuit 40 is assumed to have an output impedance of 1 kΩ.

Also, the following values are assumed: VDD=0.75 V and, in an initial state, VBP=VBP2=1.75 V and VBN=VBN2=−1 V. At time 10 μs, the voltage (voltage supply 52) to the gate of each nMOS is changed from −1.25 V to +1.75 V turning the nMOS from off to on and the voltage (voltage supply 51) to the gate of each pMOS is changed from 2 V to −1 V turning the pMOS from off to on. As a result, VBP and VBP2 changes toward VDD (=0.75 V) and VBN changes toward GND (=0 V). The speed of voltage change will be compared between the modification example (FIG. 28) and the example for comparison (FIG. 29). To be specific, the amounts of time taken until the changes of the respective voltages reach 80% of the target voltage changes, that is, the time taken until VBP and VBP2 each reach 0.95 V and the time taken until VBN reaches −0.2 V.

In the example for comparison, the VBN changes in 0.8 μs to be quick enough, but the change of the VBP takes as much as 42 μs. While the p-type well side can be discharged quick enough even via the ground, discharging on the n-type well side takes time by being affected by the output impedance of the power supply circuit.

In the modification example, on the other hand, the change of the VBN is slower taking 2 μs, but the change of the VBP for the n-type well coupled with the p-type well is quick taking 5 μs and the change of the VBP2 discharging only from the n-type well is also quick taking 8 μs. This is because discharging is not affected by the output impedance of the power supply circuit. Thus, in the modification example, the substrate bias can be discharged at high speed without being affected by the power supply circuit. Particularly, where a p-type well and an n-type well are coupled, the potential difference at the time of discharging is larger than where a p-type well/n-type well is not coupled with an n-type well/p-type well and the larger potential difference makes discharging faster. The results of a simulation according to the modification example has been described and the results apply to the foregoing working example, too.

The invention made by the present inventors has been described based on an embodiment, a working example and a modification example, but the present invention is not limited to the above embodiment, working example and modification example and can be modified in various ways.

For example, according to the working example, deep n-type wells are formed in a p-type substrate, but, alternatively, deep p-type wells may be formed in an n-type substrate. In the alternative case, the total capacitance of all p-type wells is larger than the total capacitance of all n-type wells. Hence, the second n-type well region (wWell 2) 21B is coupled to the path 61 and the second p-type well region (pWell2) 11B is not coupled to the path 61.

Also, even though, in the working example, an internal power supply circuit is provided, the invention is also applicable to cases where no internal power supply circuit is provided.

What is claimed is:

1. A semiconductor device comprising:
a circuit including an n-channel type MOSFET and a p-channel type MOSFET and having an active state and a stand-by state;
an n-type well for the p-channel type MOSFET, the n-type well being applied with a power supply voltage of the circuit in the active state and being applied with a voltage higher than the power supply voltage in the stand-by state;
a p-type well for the n-channel type MOSFET, the p-type well being applied with a ground voltage of the circuit in the active state and being applied with a voltage lower than the ground voltage in the stand-by state;
a path which electrically couples the n-type well and the p-type well when the circuit shifts from the stand-by state to the active state; and
a switch which couples the n-type well and the p-type well with the path,
wherein the switch includes a first switch, a second switch, and a third switch,
wherein the n-type well includes a first region coupled to the path via the first switch and a second region not coupled to the path,
wherein the p-type well includes a third region coupled to the path via the second switch and a fourth region coupled to the path via the third switch, and
wherein, while the first switch, the second switch, and the third switch are on, the first region of the n-type well, the third region of the p-type well and the fourth region of the p-type well are coupled via the path.

2. The semiconductor device according to claim 1, wherein a capacitance of the first region of the n-type well and a capacitance of the third region and the fourth region of the p-type well are equal.

3. The semiconductor device according to claim 1, wherein, at a time of a transition of the circuit from the stand-by state to the active state, the first switch turns off upon equalization of a potential of the first region of the n-type well and a power supply potential, the second switch turns off upon equalization of a potential of the third region of the p-type well and a ground potential, and the third switch turns off upon equalization of a potential of the fourth region and the ground potential.

4. The semiconductor device according to claim 3, further comprising a fourth switch which couples the second region of the n-type well with ground,
wherein, when the circuit shifts from the stand-by state to the active state, the fourth switch is turned on and, subsequently, the fourth switch is turned off upon equalization of a potential of the second region of the n-type well and the power supply potential.

5. The semiconductor device according to claim 4, further comprising:
a diode with an anode coupled to the first switch and a cathode coupled to the path; and
a diode with an anode coupled to the fourth switch and a cathode coupled to the ground.

6. The semiconductor device according to claim 1, wherein the circuit includes a first function block including the first region and the third region and a second function block including the second region and the fourth region.

7. The semiconductor device according to claim 6, wherein the first function block includes a CPU, the first function block shifting from the active state to the stand-by state when the CPU executes a low power consumption instruction, and shifting from the stand-by state to the active state based on an interrupt request.

* * * * *